United States Patent
Lee et al.

(10) Patent No.: US 12,287,669 B2
(45) Date of Patent: Apr. 29, 2025

(54) FOLDABLE ELECTRONIC DEVICE

(71) Applicant: Samsung Electronics Co., Ltd., Gyeonggi-do (KR)

(72) Inventors: Minsoo Lee, Gyeonggi-do (KR); Younghun Seong, Gyeonggi-do (KR); Jaehoon Lee, Gyeonggi-do (KR); Wanjae Ju, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 141 days.

(21) Appl. No.: 17/885,027

(22) Filed: Aug. 10, 2022

(65) Prior Publication Data
US 2022/0386487 A1  Dec. 1, 2022

Related U.S. Application Data

(63) Continuation of application No. PCT/KR2021/001783, filed on Feb. 10, 2021.

(30) Foreign Application Priority Data

Feb. 10, 2020 (KR) .......................... 10-2020-0015922

(51) Int. Cl.
*G06F 1/16* (2006.01)
*H04M 1/02* (2006.01)
(Continued)

(52) U.S. Cl.
CPC .......... *G06F 1/1616* (2013.01); *G06F 1/1641* (2013.01); *G06F 1/1652* (2013.01);
(Continued)

(58) Field of Classification Search
CPC .... G06F 1/1616; G06F 1/1641; G06F 1/1652; G06F 1/1681; G06F 1/1683;
(Continued)

(56) References Cited

U.S. PATENT DOCUMENTS 9,811,119 B2 * 11/2017 Seo ...................... G06F 1/1641
9,927,845 B1    3/2018 Holung
(Continued)

FOREIGN PATENT DOCUMENTS

DE        4412278     10/1995
JP     2002-158458     5/2002
(Continued)

OTHER PUBLICATIONS

European Search Report dated Oct. 13, 2022 issued in counterpart application No. 21753686.1-1224, 12 pages.
(Continued)

*Primary Examiner* — Rockshana D Chowdhury
(74) *Attorney, Agent, or Firm* — The Farrell Law Firm, P.C.

(57) ABSTRACT

A foldable electronic device is provided. The foldable electronic device includes a foldable housing including a first housing portion, a second housing portion, and a hinge structure connected with the first housing portion and the second housing portion, the foldable housing configured to be folded about a folding axis; a flexible display accommodated in the first housing portion and the second housing portion; a plurality of rigid printed circuit boards (RPCBs) including a first RPCB accommodated in the first housing portion and a second RPCB accommodated in the second housing portion; a first flexible printed circuit board (FPCB) configured to electronically connect with the first RPCB and the second RPCB, the first FPCB including a first flexible portion located through a designated area of the hinge structure, the first FPCB including a first rigid portion and a second rigid portion affixed to a part of the hinge structure; a second FPCB configured to electronically connect with the first RPCB and the second RPCB, the second FPCB including a second flexible portion located through the designated (Continued)

area of the hinge structure, the second FPCB including a third rigid portion and a fourth rigid portion affixed to a part of the hinge structure, wherein the second flexible portion of the second FPCB is spaced apart and substantially parallel from the first flexible portion of the first FPCB; and a bending-guide member attached to the first FPCB between the first rigid portion and the second rigid portion, and attached to the second FPCB between the third rigid portion and the fourth rigid portion such that the first flexible portion and the second flexible portion are held together.

15 Claims, 20 Drawing Sheets

(51) Int. Cl.
*H05K 5/00* (2006.01)
*H05K 5/02* (2006.01)

(52) U.S. Cl.
CPC ........ *G06F 1/1681* (2013.01); *H04M 1/0216* (2013.01); *H04M 1/0268* (2013.01); *H04M 1/0277* (2013.01); *H05K 5/0018* (2022.08); *H05K 5/0226* (2013.01)

(58) Field of Classification Search
CPC ............. H04M 1/0216; H04M 1/0268; H04M 1/0277; H04M 1/0266; H05K 5/0018; H05K 5/0226
See application file for complete search history.

(56) References Cited

U.S. PATENT DOCUMENTS

| | | | | |
|---|---|---|---|---|
| 10,054,990 | B1* | 8/2018 | Harmon | G06F 1/1652 |
| 10,075,573 | B2 | 9/2018 | Zhang | |
| 10,219,397 | B2* | 2/2019 | Choi | H05K 1/0281 |
| 10,469,635 | B1 | 11/2019 | Carlson | |
| 10,485,116 | B2* | 11/2019 | Kim | G06F 1/1641 |
| 10,623,538 | B1 | 4/2020 | Carlson | |
| 11,016,527 | B2 | 5/2021 | Park | |
| 11,221,648 | B2 | 1/2022 | Myeong | |
| 11,762,423 | B2* | 9/2023 | Hiroki | G06F 1/1643 |
| | | | | 361/679.55 |
| 2008/0062661 | A1 | 3/2008 | Choi et al. | |
| 2010/0294556 | A1 | 11/2010 | Chuo et al. | |
| 2011/0230146 | A1 | 9/2011 | Morishita et al. | |
| 2012/0062447 | A1 | 3/2012 | Tseng | |
| 2012/0120618 | A1 | 5/2012 | Bohn | |
| 2014/0029212 | A1 | 1/2014 | Hwang et al. | |
| 2014/0217373 | A1 | 8/2014 | Youn | |
| 2014/0232956 | A1 | 8/2014 | Kwon | |
| 2014/0375529 | A1 | 12/2014 | Yun | |
| 2015/0286288 | A1 | 10/2015 | Lee | |
| 2016/0070304 | A1 | 3/2016 | Shin et al. | |
| 2016/0093685 | A1 | 3/2016 | Kwon | |
| 2016/0301150 | A1 | 10/2016 | Choi et al. | |
| 2017/0084673 | A1 | 3/2017 | Lee et al. | |
| 2017/0227993 | A1 | 8/2017 | Holung | |
| 2017/0302772 | A1 | 10/2017 | Zhang et al. | |
| 2017/0351297 | A1 | 12/2017 | Kim et al. | |
| 2017/0357289 | A1 | 12/2017 | Ahn | |
| 2018/0324964 | A1 | 11/2018 | Yoo et al. | |
| 2018/0356917 | A1* | 12/2018 | Lee | H05K 3/285 |
| 2019/0014674 | A1 | 1/2019 | Lin | |
| 2019/0196548 | A1 | 6/2019 | Kim et al. | |
| 2019/0207167 | A1* | 7/2019 | Lee | H10K 59/131 |
| 2019/0208642 | A1* | 7/2019 | Eun | G06F 1/1658 |
| 2019/0212781 | A1* | 7/2019 | Fujimoto | G06F 1/1643 |
| 2019/0302850 | A1 | 10/2019 | Park et al. | |
| 2019/0339739 | A1 | 11/2019 | Park | |
| 2019/0373719 | A1* | 12/2019 | Lee | H05K 1/0203 |
| 2019/0384088 | A1* | 12/2019 | Jung | G02F 1/13452 |
| 2020/0036198 | A1 | 1/2020 | Kim et al. | |
| 2020/0060020 | A1 | 2/2020 | Park | |
| 2020/0162596 | A1 | 5/2020 | Kim | |
| 2020/0201393 | A1* | 6/2020 | Ahn | G06F 1/1626 |
| 2020/0203642 | A1* | 6/2020 | Kim | B32B 15/18 |
| 2020/0351393 | A1 | 11/2020 | Kang | |
| 2020/0363882 | A1* | 11/2020 | Nam | H05K 1/189 |
| 2021/0166590 | A1* | 6/2021 | Jung | G09F 9/301 |
| 2021/0250856 | A1* | 8/2021 | Han | G06F 1/1652 |
| 2021/0263558 | A1 | 8/2021 | Bie et al. | |
| 2021/0360814 | A1 | 11/2021 | Hong | |
| 2022/0078934 | A1* | 3/2022 | Lee | G06F 1/1652 |
| 2022/0291720 | A1* | 9/2022 | Luo | G06F 1/181 |
| 2022/0394852 | A1* | 12/2022 | Zhang | H05K 1/147 |
| 2023/0051888 | A1* | 2/2023 | Yoo | H10K 59/351 |

FOREIGN PATENT DOCUMENTS

| | | |
|---|---|---|
| KR | 1020070090615 | 9/2007 |
| KR | 1020080023554 | 3/2008 |
| KR | 1020110097897 | 8/2011 |
| KR | 10-2013-0097497 | 9/2013 |
| KR | 1020140015881 | 2/2014 |
| KR | 1020160029543 | 3/2016 |
| KR | 1020170136258 | 12/2017 |
| KR | 1020180014407 | 2/2018 |
| KR | 1020190062107 | 6/2019 |
| KR | 1020190078994 | 7/2019 |
| KR | 1020190080740 | 7/2019 |
| KR | 1020190002000 | 8/2019 |
| KR | 1020190116592 | 10/2019 |
| KR | 1020200012105 | 2/2020 |
| KR | 10-2340063 | 12/2021 |
| KR | 1020160121178 | 12/2021 |
| WO | WO 2020/014865 | 1/2020 |

OTHER PUBLICATIONS

International Search Report dated May 31, 2021 issued in counterpart application No. PCT/KR2021/001783, 5 pages.
Korean Office Action dated Jan. 15, 2024 issued in counterpart application No. 10-2020-0015922, 17 pages.
Korean Office Action dated Sep. 11, 2024 issued in counterpart application No. 10-2020-0015922, 9 pages.
Chinese Office Action dated Dec. 24, 2024 issued in counterpart application No. 202211388836.4, 10 pages.

* cited by examiner

FOLDABLE ELECTRONIC DEVICE

CROSS-REFERENCE TO RELATED APPLICATION(S)

This application is a Bypass National Phase Entry of PCT International Application No. PCT/KR2021/001783, which was filed on Feb. 10, 2021, which is based on and claims priority under 35 U.S.C. § 119 to Korean Patent Application No. 10-2020-0015922, filed on Feb. 10, 2020, in the Korean Intellectual Property Office, the disclosure of which is incorporated by reference herein in its entirety.

BACKGROUND

1. Field

The present disclosure relates generally to a flexible circuit board disposed in a foldable electronic device.

2. Description of Related Art

As the degree of integration of electronic devices has increased and super-high-speed and large-capacity radio frequency (RF) communication has become popular, multiple functions have recently come to be provided in a single electronic device, such as a mobile communication terminal. For example, various functions, such as an entertainment function (e.g., a game function), a multimedia function (e.g., a music/video reproduction function), a communication and security function for mobile banking, a schedule management function, an e-wallet function may, and a communication function may be integrated in a single electronic device. In addition, electronic devices are increasingly equipped with wider display panels so that users have less inconvenience using multimedia services.

Foldable electronic devices with flexible display panels have been recently developed. A foldable electronic device may refer to an electronic device that includes a plurality of housing structures, which rotate with respect to each other.

Circuit boards disposed in electronic devices may be divided into rigid circuit boards and flexible circuit boards according to physical characteristics related to the flexibility thereof. A rigid-flexible circuit board (hereinafter referred to as a "flexible circuit board") in which a rigid circuit board and a flexible circuit board are combined may be provided so as to increase the reliability of an electrical connection of an electronic device and to implement three-dimensional wiring.

Since the commercialization of fourth generation (4G) communication systems, in order to meet the increasing demand for wireless data traffic, fifth generation (5G) communication systems have been actively developed and distributed. In order to achieve a high data rate, the 5G communication systems use an ultra-high frequency of several tens of gigahertz (GHz) or more (or referred to as "mmWave communication"). However, in an electronic device including an ultra-high frequency communication module, performance exhibited by the communication module may be affected by a path (e.g., a wire) through which a communication signal is transmitted due to high frequency characteristics.

Accordingly, for foldable electronic devices, it may be necessary to provide a flexible circuit board capable of preventing deterioration of the RF characteristics of signals.

SUMMARY

The present disclosure has been made to address the above-mentioned problems and disadvantages, and to provide at least the advantages described below.

In accordance with an aspect of the present disclosure, a foldable electronic device is provided. The foldable electronic device includes a foldable housing including a first housing portion, a second housing portion, and a hinge structure connected with the first housing portion and the second housing portion, the foldable housing configured to be folded about a folding axis; a flexible display accommodated in the first housing portion and the second housing portion; a plurality of rigid printed circuit boards (RPCBs) including a first RPCB accommodated in the first housing portion and a second RPCB accommodated in the second housing portion; a first flexible printed circuit board (FPCB) configured to electronically connect with the first RPCB and the second RPCB, the first FPCB including a first flexible portion located through a designated area of the hinge structure, the first FPCB including a first rigid portion and a second rigid portion affixed to a part of the hinge structure; a second FPCB configured to electronically connect with the first RPCB and the second RPCB, the second FPCB including a second flexible portion located through the designated area of the hinge structure, the second FPCB including a third rigid portion and a fourth rigid portion affixed to a part of the hinge structure, wherein the second flexible portion of the second FPCB is spaced apart and substantially parallel from the first flexible portion of the first FPCB; and a bending-guide member attached to the first FPCB between the first rigid portion and the second rigid portion, and attached to the second FPCB between the third rigid portion and the fourth rigid portion such that the first flexible portion and the second flexible portion are held together.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
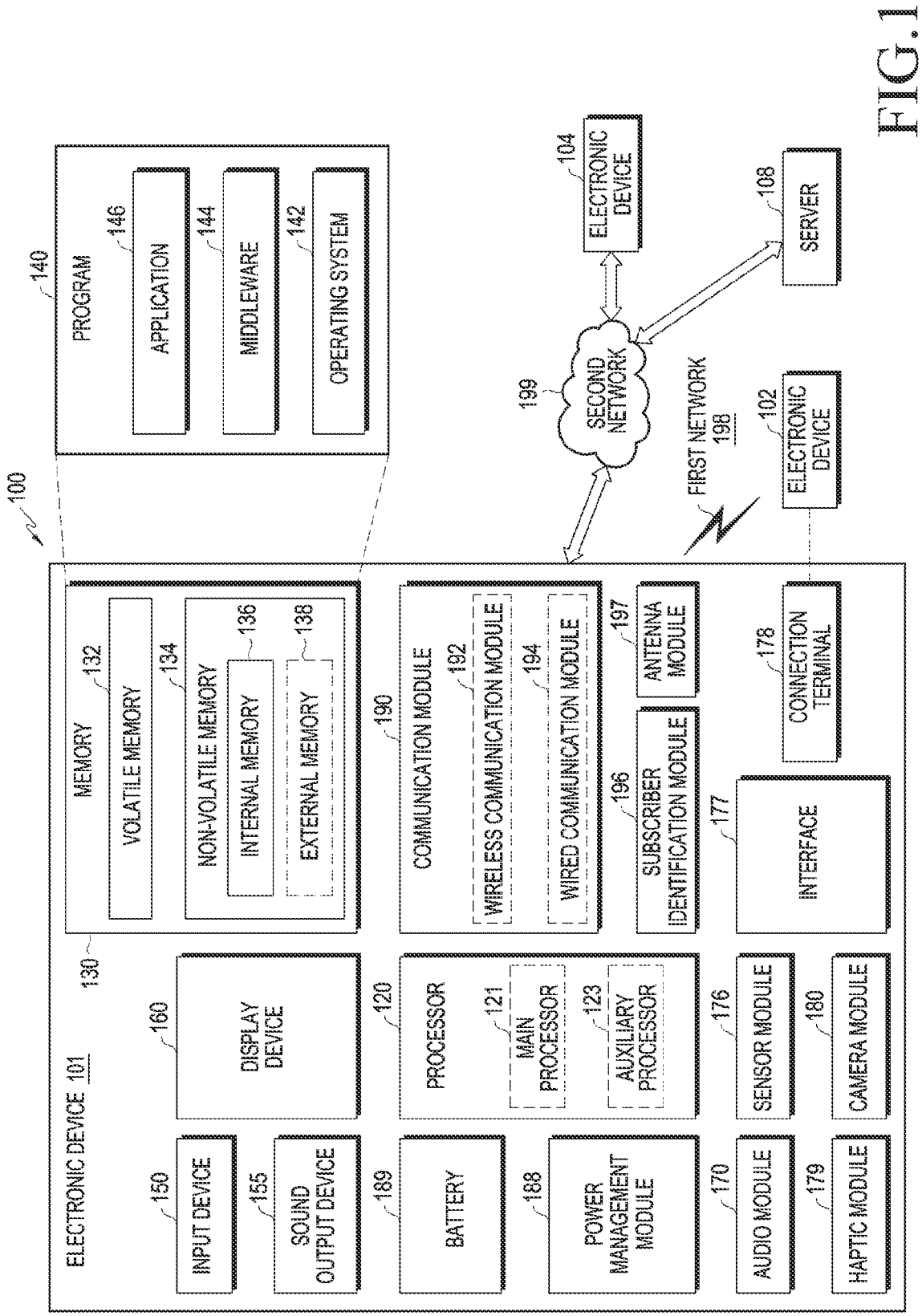
FIG. 1 is a block diagram of an electronic device, according to an embodiment.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

In an electronic device, various electronic elements (or electronic components) and a printed circuit board on which the various electronic elements are mounted may be disposed inside a bracket on which components are mounted. In the case of a foldable electronic device, the electronic elements and the printed circuit board may be separately disposed in a plurality of housing structures based on various factors such as space for mounting, communication performance, and heat dissipation performance. A flexible circuit board, which is easily bent, may be used in order to connect electronic elements.

Since at least a portion of the flexible circuit board can be flexibly bent, the flexible circuit board may be highly utilized in a narrow space, and may be suitable for use in a configuration that connects the electronic elements contained inside a housing structure. However, durability and service life aspects may need to be additionally considered.

According to some embodiments, when a foldable electronic device is repeatedly folded and unfolded, stress due to friction with a housing, a component, or another board accumulates in a bent portion of a flexible circuit board, which may result in damage.

In addition, according to some embodiments, the shape (and/or position) of a bent portion of a flexible circuit board may not be able to be constantly maintained when the bent portion moves within a designated area (i.e., when a designated shape of the bent portion is not maintained). In addition, the designated shape of the bent portion may become deformed during repeated use of the foldable electronic device, so the service life may be shortened.

When the foldable electronic device is equipped with an ultra-high frequency communication module (e.g., ultra-high communication in the range of 6 GHz or more and less than 100 GHz) (for example, when a flexible circuit board including an RF signal line is included), since a flexible circuit board designed in consideration of RF characteristics is formed to have a thinner width compared to a board including a general signal line, it may be difficult to maintain the designated shape of the bent portion. In addition, when the designated shape of the bent portion is deformed rather than being maintained, the impedance of the flexible circuit board including the RF signal line may be changed, resulting in a decrease in RF characteristics and an increase in signal loss.

Various embodiments of the present disclosure are capable of providing a foldable electronic device capable of maintaining a form of a flexible circuit board even when the foldable electronic device is repeatedly folded and unfolded, so that damage to the flexible circuit board, shortening of the service life of the flexible circuit board, and deterioration of the RF characteristics of the flexible circuit board can be prevented.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
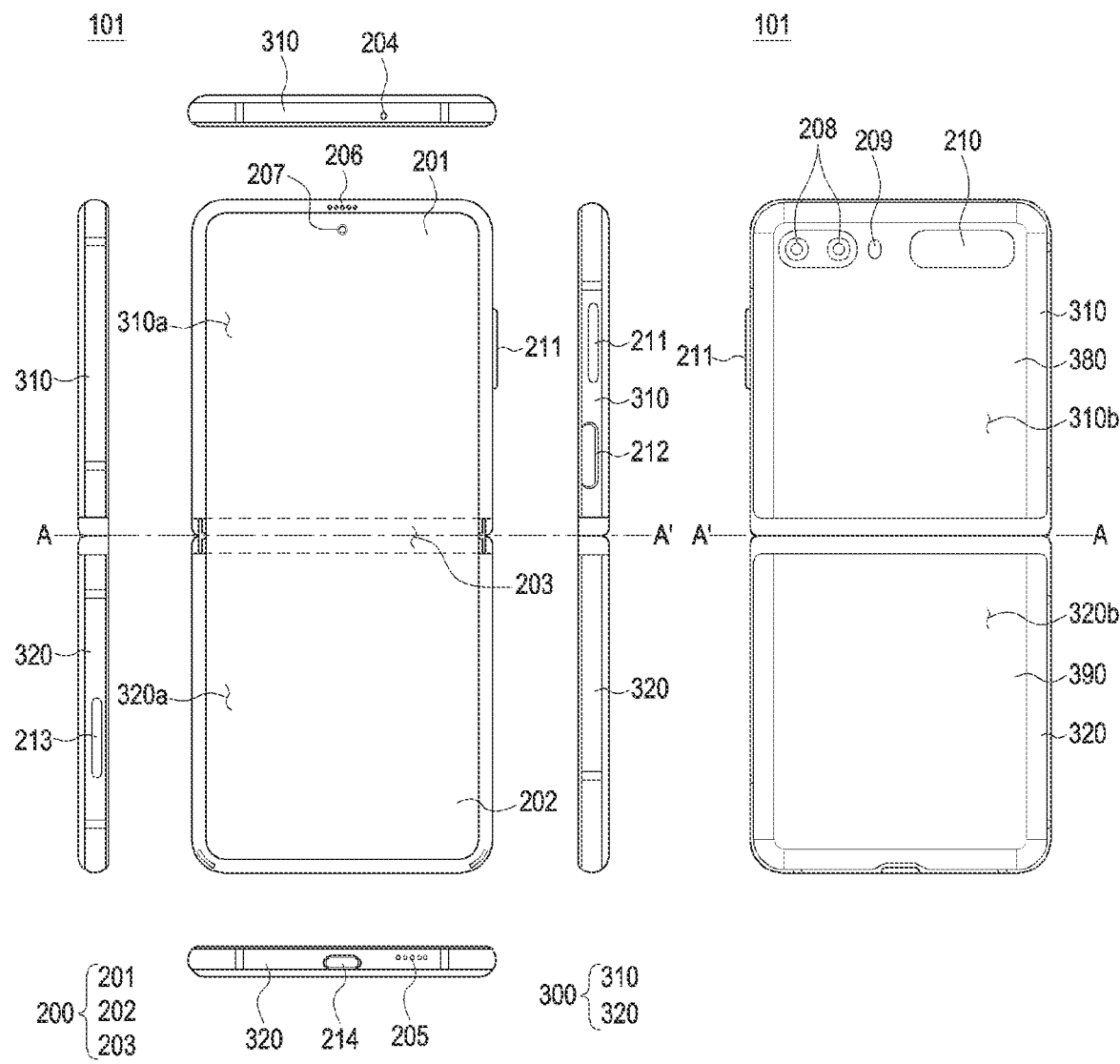
FIG. 2 is a view illustrating the state in which an electronic device is unfolded, according to an embodiment.
Figure 3A:
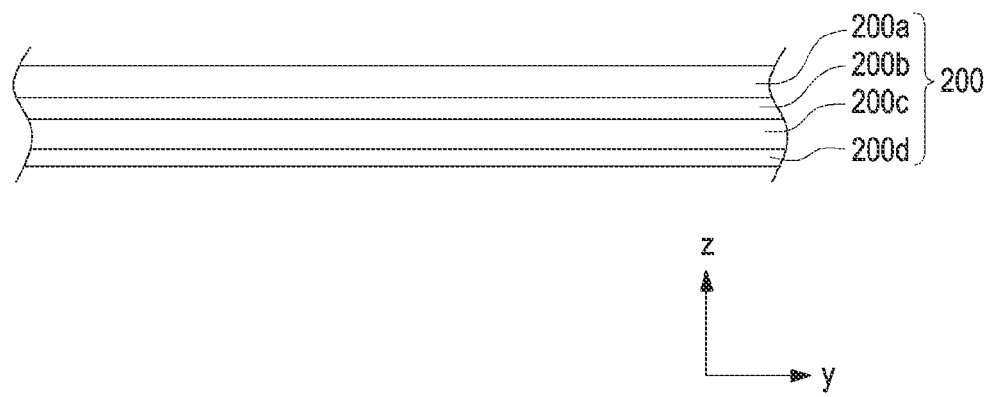
FIG. 3A is a cross-sectional view illustrating the state in which a display part of an electronic device is fully unfolded, according to an embodiment is.
Figure 3B:
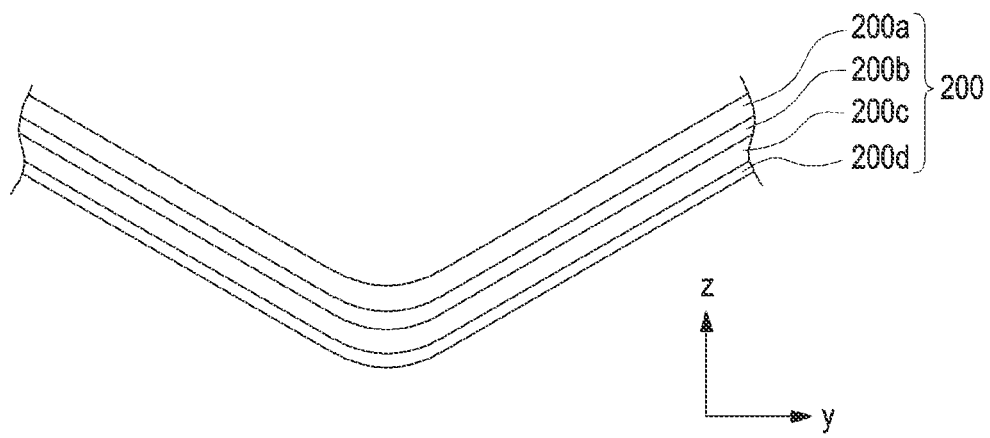
FIG. 3B is a cross-sectional view illustrating the intermediate state in which a display part of an electronic device is partially unfolded, according to an embodiment.

FIG. 2 is a view illustrating the state in which an electronic device 101 is unfolded, according to an embodiment. FIG. 2 illustrates the front, rear, and side surfaces of the electronic device 101. FIG. 3A is a cross-sectional view illustrating the state in which a display part of an electronic device 101 is fully unfolded, according to an embodiment. FIG. 3B is a cross-sectional view illustrating the intermediate state in which a display part of the electronic device 101 is partially unfolded, according to an embodiment.

Referring to FIG. 2, an electronic device 101 includes a foldable housing 300 and a flexible or foldable display 200 disposed in a space defined by the foldable housing 300.

The surface on which the display 200 is disposed may be the front surface of the electronic device 101. At least a portion of the front surface of the electronic device 101 may be a substantially transparent front plate (e.g., a glass plate or a polymer plate including various coating layers). The surface opposite the front surface may be the rear surface of the electronic device 101. The rear surface of the electronic device 101 may be a substantially opaque rear plate or rear cover. The rear cover may be formed of, for example, coated or colored glass, ceramic, a polymer, a metal (e.g., aluminum, stainless steel (STS), or magnesium), or a combination of at least two of these materials. In addition, the surface surrounding the space between the front surface and the rear surface may be a side surface of the electronic device 101. The side surface may be a side bezel structure or side member coupled to the front plate and the rear cover and including a metal and/or a polymer. The rear cover and the side bezel structure may be integrally formed, and may include the same material (e.g., a metal material such as aluminum).

The electronic device 101 may include at least one of a display 200; a microphone hole 204; speaker holes 205 and 206; a sensor module 209; camera modules 207 and 208; key input devices 211, 212, and 213; and a connector hole 214. In the electronic device 101, at least one of the components (e.g., the key input devices 211, 212, and 213) may be omitted, or other components (e.g., a light-emitting element) may be additionally included.

A portion of the display 200 may be deformable into a planar surface or a curved surface. The display 200 may include a folding area 203, a first area 201 disposed on one side of the folding area 203 (e.g., the top side of the folding area 203), and a second area 202 disposed on the other side of the folding area 203 (e.g., the bottom side of the folding area 203). However, the display 200 may be divided into multiple areas (e.g., two areas or four or more areas) depending on the structure or function thereof. For example, the areas of the display 200 may be divided on the basis of the folding area 203 or a folding axis A-A'. Alternatively, the areas of the display 200 may be divided on the basis of another folding area or another folding axis (e.g., a folding axis perpendicular to the folding axis A-A').

The microphone hole 204 may include a microphone disposed therein so as to acquire external sound, and multiple microphones may be disposed therein so as to enable detection of the direction of sound. The speaker holes 205 and 206 may include an external speaker hole and a phone call receiver hole. The speaker holes 205 and 206 and the microphone hole 204 may be implemented as a single hole, or a speaker may be included without the speaker holes 205 and 206 (e.g., piezo speakers). The locations and number of the microphone hole 204 and speaker holes 205 and 206 may be variable.

The camera modules 207 and 208 may include a first camera device disposed on the first surface 310a of the first housing 310 of the electronic device 101 and a second camera device 208 disposed on the second surface 310b of the first housing 310 of the electronic device 101. In addition, the electronic device 101 may further include a flash. The camera devices 207 and 208 may include one or more lenses, an image sensor, and/or an ISP. The flash may include, for example, a light-emitting diode or a xenon lamp.

The sensor module 209 may generate an electrical signal or a data value corresponding to an internal operating state of the electronic device 101 or an external environmental state. The electronic device 101 may additionally include another sensor module in addition to the sensor module 209 provided on the second surface 310b of the first housing 310, or may include another sensor module instead of the sensor module 209. The electronic device 101 may include, as a sensor module, at least one of, for example, a proximity sensor, a fingerprint sensor, a heart rate monitor (HRM) sensor, a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, or an illuminance sensor.

Key input devices 211, 212, and 213 may be disposed on the side surface of the foldable housing 300. The electronic device 101 may not include some or all of the above-mentioned key input devices 211, 212, and 213, and a key input device, which is not included in the electronic device 101, may be implemented in another form, such as a soft key, on the display 200. The key input devices may be configured such that key input is implemented by a sensor module.

The connector hole 214 may be configured to accommodate a connector (e.g., a USB connector) configured to transmit and receive power and/or data to and from an external electronic device, and to accommodate, in addition to or instead of the connector, a connector configured to transmit and receive an audio signal to and from an external electronic device.

The foldable housing 300 may include a first housing structure 310, a second housing structure 320, a first rear cover 380, a second rear cover 390, and a hinge structure 440. The foldable housing 300 of the electronic device 101 may be implemented by a combination and/or an assembly of different shapes or components. For example, the first housing structure 310 and the first rear cover 380 may be integrally formed, and the second housing structure 320 and the second rear cover 390 may be integrally formed. The term "housing structure" may be a combination and/or an assembly of various components, including a housing.

The first housing structure 310 may be connected to a hinge structure, and may include a first surface 310a facing in a first direction and a second surface 310b facing in a second direction opposite the first direction. The second housing structure 320 may be connected to a hinge structure 440, and may include a third surface 320a facing in a third direction and a fourth surface 320b facing in a fourth direction opposite the third direction. The second housing structure 320 may be rotatable about the hinge structure (or the folding axis A-A') relative to the first housing structure 310.

The first housing structure 310 and the second housing structure 320 may be disposed on opposite sides (or upper and lower sides) about the folding axis A-A', and may have a generally symmetrical shape with respect to the folding axis A-A'. The first housing 310 and the second housing 320 may form an angle or a distance therebetween, which may be variable depending on whether the electronic device 101 is in an unfolded state, in a folded state, or in an intermediate state. Unlike the second housing structure 320, the first housing structure 310 may further include various sensors. However, the first housing structure 310 and the second housing structure 320 may have mutually symmetrical shapes in other areas.

At least a portion of the first housing structure 310 and at least a portion of the second housing structure 320 may be formed of a metal material or a non-metal material having rigidity of a level selected so as to support the display 200. The at least a portion formed of the metal material may provide a ground plane of the electronic device 101, and may be electrically connected to a ground line formed on a printed circuit board 430.

The first rear cover 380 may be disposed on one side of the folding axis A-A' on the rear surface of the electronic device 101, and may have, for example, a substantially rectangular periphery, which may be enclosed by the first housing structure 310. Similarly, the second rear cover 390 may be disposed on the other side of the folding axis A-A' of the rear surface of the electronic device 101, and the periphery of the second rear cover 390 may be enclosed by the second housing structure 320.

The first rear cover 380 and the second rear cover 390 may have substantially symmetrical shapes about the folding axis A-A'. However, the first rear cover 380 and the second rear cover 390 must not necessarily have mutually symmetrical shapes, and an electronic device 101 may include a first rear cover 380 and a second rear cover 390 having various shapes. Additionally, the first rear cover 380 may be formed integrally with the first housing structure 310, and the second rear cover 390 may be formed integrally with the second housing structure 320.

The first rear cover 380, the second rear cover 390, the first housing structure 310, and the second housing structure 320 may define a space in which various components (e.g., a printed circuit board or a battery) of the electronic device 101 can be disposed. One or more components may be disposed or visually exposed on the rear surface of the electronic device 101. For example, at least a portion of a sub-display 210 may be visually exposed through the first rear cover 380. Additionally, one or more components or sensors may be visually exposed through the first rear cover 380. The sensors may include a proximity sensor and/or a rear camera. One or more components or sensors may be visually exposed through the second rear cover 390.

A front camera 207 exposed to the front surface of the electronic device 101 through one or more openings or a rear camera 208 exposed through of the first rear cover 380 may include one or more lenses, an image sensor, and/or an ISP. The flash 209 may include a light-emitting diode or a xenon lamp. Two or more lenses (e.g., an infrared camera lens, a wide-angle lens, and a telephoto lens) and image sensors may be disposed on one surface of the electronic device 101.

FIG. 3A represents a fully unfolded state of the display part, and FIG. 3B represents a partially unfolded state (or partially folded state) of the display part.

The display part of the electronic device 101 may include a configuration that displays a screen and a configuration that is connected to the display and moves integrally with the display. Referring to FIG. 3A, the display part may include a display panel 200c and a touch panel 200d disposed adjacent to the display panel 200c.

The electronic device 101 may be adjusted to a folded state or an unfolded state. The electronic device 101 may be an "in-folding" type in which the front surface of the electronic device 101 is folded to form an acute angle when viewed in the direction of the folding axis (e.g., A-A' in FIG. 2), and an "out-folding" type in which the front surface of the electronic device 101 is folded to form an obtuse angle when viewed in the direction of the folding axis. For example, in the electronic device 101, the first surface 310a may face the third surface 320a in the state in which the electronic device 101 is in the folded state in the in-folding type, and the third direction may be the same as the first direction in the fully unfolded state. In another example, in the state in which the electronic device 101 is folded in the out-folding type, the second surface 310b may face the fourth surface 320b.

The in-folding type may mean the type in which the display 200 is not exposed to the outside in the fully folded state. The out-folding type may mean the type in which the display 200 is exposed to the outside in the fully folded state. FIG. 3B illustrates an intermediate state in which the electronic device 101 is partially unfolded in the process in which the electronic device 101 is folded in the in-folding type. Hereinafter, for convenience, the electronic device 101 will be described focusing on the state of being folded in the in-folding type, but it should be noted that these descriptions may be applicable, mutatis mutandis, to the state in which the electronic device 101 is folded in the out-folding type.

The display 200 may include a display panel 200c, a polarizing layer 200b disposed on the display panel 200c, and a window member 200a forming the appearance of the display. The display panel 200c, the polarizing layer 200b, and the window member 200a form one display 200, and may be formed of a flexible material. Accordingly, as illustrated in FIG. 3A, when an external force is applied in the state in which the display 200 is unfolded, the display 200 may be bent as illustrated in FIG. 3B. Alternatively, when an external force is applied in the state in which the display 200 is partially folded as illustrated in FIG. 3B, the display 200 may be unfolded as illustrated FIG. 3A.

The electronic device 101 may detect input (e.g., a user's input or input through the input device 150) on the surface of the display 200 using the touch panel 200d. Here, the input capable of being recognized by the touch panel 200d may include not only input through direct contact with the surface of the display 200, but also input through hovering. The touch panel 200d may have substantially the same area as the display 200. The touch panel 200d may be disposed on the top surface or the rear surface of the display 200. FIGS. 3A and 3B illustrate the state in which the touch panel 200d is attached to the rear surface of the display 200.

The display device 200 may be at least partially made of a material that transmits radio waves or magnetic fields. Since the display 200 may be equipped with a display panel 200c and/or a touch panel 200d, the display 200 may be used as an output device that outputs a screen and as an input device that is provided with a touch screen function. The display panel 200c may include a display element layer including one or more pixels and a thin-film transistor (TFT) layer connected to the display element layer. The display panel 200c may correspond to a panel such as a liquid crystal display (LCD), a light-emitting diode (LED), or an organic light-emitting diode (OLED), and may display various images according to various operation states, executed applications, and contents of the electronic device 101.

The touch panel 200d may include various types of touch. For example, various touch panels, such as a capacitive touch panel that detects a change in capacitance, a pressurized touch panel that detects a position by detecting a pressure acting on the panel, an optical touch panel using infrared rays, and a transparent-electrode-type touch panel using contacts of a transparent conductive film, may be used. In addition, various types of input position detection panels, such as an electromagnetic-resonance-type touch panel, may be used.

The window member 200a may serve as a protective film for protecting the display panel 200c. As a protective film, the window member 200a may be made of a material that protects the display panel 200c from external impacts, that is resistant to scratches, and that generates less wrinkles in the folding area even when the foldable housing is repeatedly folded and unfolded. A clear polyimide (CPI) film or ultra-thin glass (UTG) may be included as the material of the window member 200a.

Figure 4:
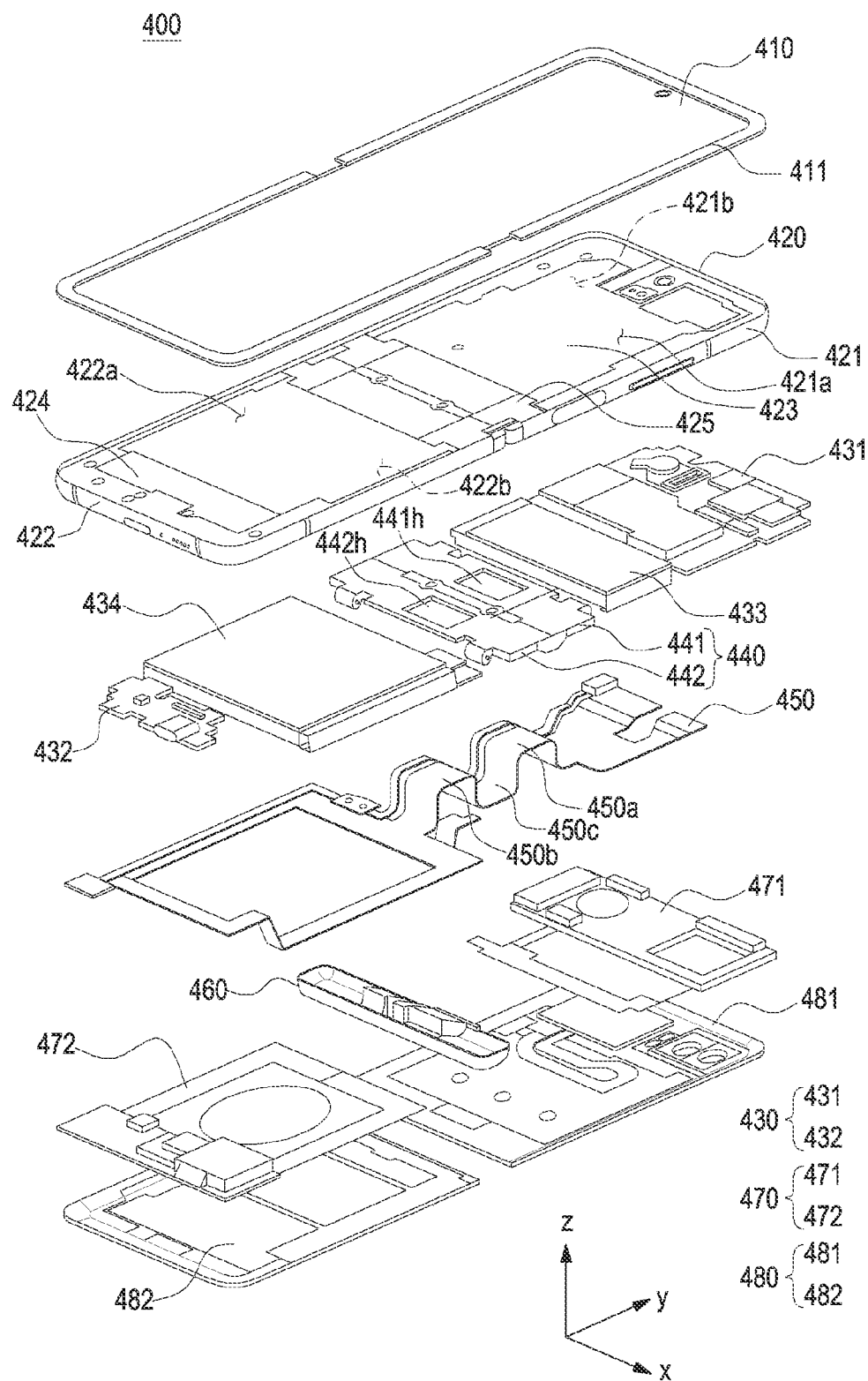
FIG. 4 is an exploded perspective view of an electronic device, according to an embodiment.

FIG. 4 is an exploded perspective view illustrating an electronic device 400, according to an embodiment.

Referring to FIG. 4, the electronic device 400 includes a display 410, a foldable housing 420, a printed circuit board 430, a hinge structure 440, a flexible connection member 450, a hinge cover 460, an antenna module 470, and a rear cover 480. Hereinafter, a detailed description of components overlapping those described with reference to FIGS. 2 and 3 (e.g., the display 410, the foldable housing 420, and the rear cover 480) will be omitted.

The display 410 may be exposed through a substantial portion of a front plate 411. The shape of the display 410 may be substantially the same as the shape of the periphery of the front plate 411.

The foldable housing 420 may include a first housing 421 and a second housing 422. The first housing 421 may include a first surface 421a and a second surface 421b facing away from the first surface 421a, and the second housing 422 may include a third surface 422a and a fourth surface 422b facing away from the third surface 422a. The foldable housing 420 may additionally or alternatively include a bracket assembly. The bracket assembly may include a first bracket assembly 423 disposed on the first housing structure 421 and a second bracket assembly 424 disposed on the second housing structure 422. At least a portion of the bracket assembly, for example, a portion 425 including at least a portion of the first bracket assembly 423 and at least a portion of the second bracket assembly 424, may serve as a plate for supporting the hinge structure 440.

Various electric elements may be disposed on the printed circuit board 430. For example, a processor 120, a memory 130, and/or an interface 177 may be mounted on the printed circuit board 430. The processor may include at least one of a CPU, an AP, a graphics processor, an ISP, a sensor hub processor, or a CP. The memory may include, for example, a volatile memory or a nonvolatile memory. The interface may include, for example, an HDMI, a USB interface, an SD card interface, and/or an audio interface. The interface may electrically or physically connect the electronic device 300 to an external electronic device, and may include a USB connector, an SD card/multimedia card (MMC) connector, or an audio connector.

The printed circuit board 430 may include a first printed circuit board 431 disposed on the first bracket assembly 423 side and a second printed circuit board 432 disposed on the second bracket assembly 424 side. The first printed circuit board 431 and the second printed circuit board 432 may be disposed in the space defined by the foldable housing 420, the bracket assembly, the first rear cover 481, and/or the second rear cover 482. Components for implementing various functions of the electronic device 400 may be mounted on the first printed circuit board 431 and the second printed circuit board 432 to be separated from each other. A processor may be disposed on the first printed circuit board 431, and an audio interface may be disposed on the second printed circuit board 432.

A battery may be disposed adjacent to the printed circuit board 430 so as to supply power to the electronic device 400. At least a portion of the battery may be disposed to be substantially flush with the printed circuit board 430. A first battery 433 may be disposed adjacent to the first printed circuit board 431, and a second battery 434 may be disposed adjacent to the second printed circuit board 432. The battery is a device for supplying power to at least one component of the electronic device 400, and may include a non-rechargeable primary battery, a rechargeable secondary battery, or a fuel cell. The battery may be integrally disposed inside the electronic device 400, or may be detachably disposed on the electronic device 400. The hinge structure 440 may be configured to support the foldable housing 420 and/or the bracket assembly such that the foldable housing 420 can rotate about a folding axis (e.g., A-A' in FIG. 2). The hinge structure 440 may include a first hinge structure 441 disposed on the first printed circuit board 431 side and a second hinge structure 442 disposed on the second printed circuit board 432 side. The hinge structure 440 may be disposed between the first printed circuit board 431 and the second printed circuit board 432. The hinge structure 440 may be formed substantially integrally with a portion 425 including at least a portion of the first bracket assembly 423 and at least a portion of the second bracket assembly 424.

The "housing structure" may be a structure that includes a foldable housing 420, and one or more components disposed inside the housing 420 may be assembled and/or combined with each other. The housing structure may include a first housing structure and a second housing structure. An assembled configuration that includes a first housing 421 and further includes at least one of the first bracket assembly 423, the first printed circuit board 431, and the first battery 433 disposed inside the first housing 421 may be referred to a "first housing structure". An assembled configuration that includes a second housing 422 and further includes at least one of the second bracket assembly 424, the second printed circuit board 432, and the second battery 434 disposed inside the second housing 422 may be referred to a "second housing structure". However, it should be noted that the "first housing structure" and the "second housing structure" are not limited to the above-described components, and other components may be additionally included or omitted.

The flexible connection member 450 may be a flexible printed circuit board (FPCB). Various electric elements disposed on the first printed circuit board 431 and the second printed circuit board 432 may be connected to each other using the flexible connection member 450. Accordingly, the flexible connection member 450 may be disposed across the "first housing structure" and the "second housing structure". The flexible connection member 450 may be disposed so as to cross at least a portion of the hinge structure 440. The flexible connection member 450 may be configured to connect the first printed circuit board 431 and the second printed circuit board 432 to each other across the hinge structure 440 in a direction parallel to the y-axis of FIG. 4. The flexible connection member 450 may be fitted and coupled to the openings 441h and 442h in the hinge structure 440. In this case, a portion 450a of the flexible connection member 450 may be disposed to cross one side (e.g., the upper portion) of the first hinge structure 441, and the other portion 450b of the flexible connection member 450 may be disposed to cross the one side (e.g., the upper portion) of the hinge structure 442. Further, another portion 450c of the flexible connection member 450 may be disposed on the other sides (e.g., the lower portions) of the first hinge structure 441 and the second hinge structure 442. At positions adjacent to the first hinge structure 441 and the second hinge structure 442, a space (hereinafter referred to as a "hinge space") surrounded by at least a portion of the first hinge structure 441, at least a portion of the second hinge structure 442, and at least a portion of the hinge cover 460 may be formed. At least a portion 450c of the flexible connection member 450 may be disposed in the hinge space.

The hinge cover 460 may be configured to at least partially surround the hinge space. The hinge cover 460 may close the hinge space together with the hinge structure 440, and may protect the structure (e.g., at least a portion 450c of the flexible connection member 450) disposed inside the hinge space from an external impact. The hinge cover 460 may be disposed between the first housing 421 and the second housing 422. The hinge cover 460 may be coupled to at least a portion of the first housing (e.g., the first rotation support 511 to be described with reference to FIG. 7) and at least a portion of the second housing (e.g., the second rotation support 521 to be described later with reference to FIG. 7).

The antenna module 470 may be disposed between the rear cover 480 and the battery. The antenna module 470 may include a plurality of antenna modules in one electronic device 400. For example, the antenna module 470 may include a first antenna module 471 disposed on the first housing 421 side and a second antenna module 472 disposed on the second housing 422 side.

The antenna module may include at least one radiator. In addition, the antenna module 470 may include, for example, a nearfield communication (NFC) antenna, a wireless charging antenna, and/or a magnetic secure transmission (MST) antenna. The antenna module 470 may perform short-range communication with an external electronic device, or may transmit/receive power required for charging to/from the external device in a wireless manner. An antenna structure may be formed by a portion of a side bezel structure of the foldable housing 420, a portion of a bracket assembly, or a combination thereof.

The rear cover 480 may include a first rear cover 481 and a second rear cover 482. The rear cover 480 may be coupled to the foldable housing 420 so as to protect the above-described components (e.g., the printed circuit board 430, the battery, the flexible connection member 450, and the antenna module 470) disposed inside the foldable housing 420. As described above, the rear cover 480 may be configured substantially integrally with the foldable housing 420.

Hereinafter, the flexible connection member 550 will be described in more detail with reference to FIGS. 5 to 8.

Figure 5:
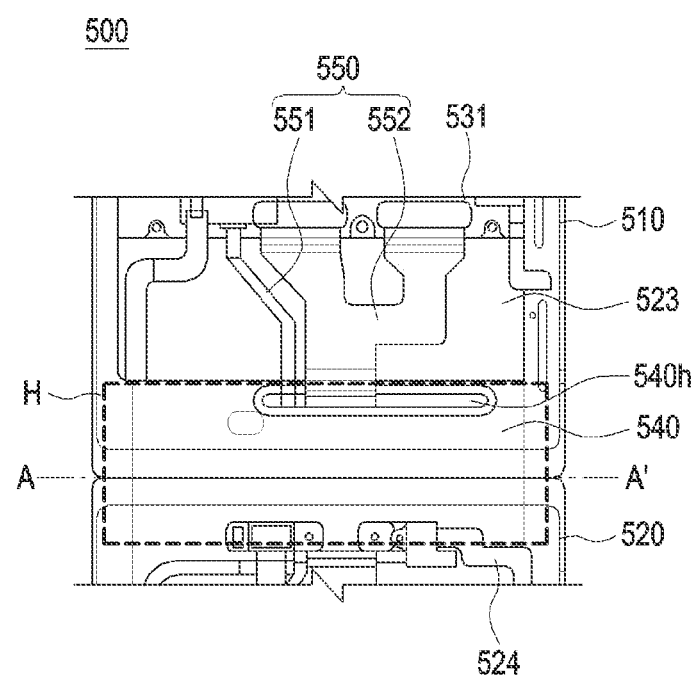
FIG. 5 is a view illustrating a portion of an inside of an electronic device, according to an embodiment.
Figure 6:
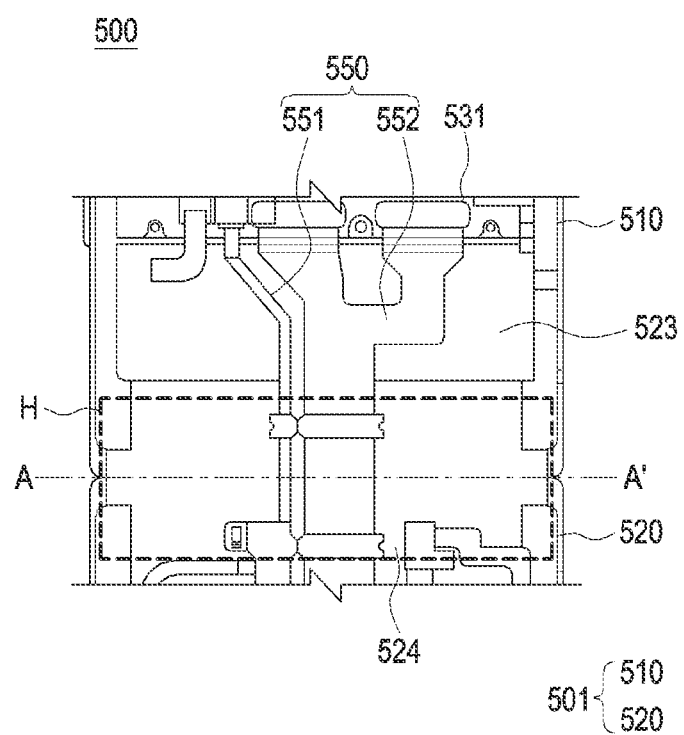
FIG. 6 is a view illustrating the state in which a hinge structure is removed in the embodiment illustrated in FIG. 5, according to an embodiment.

FIG. 5 is a view illustrating a portion of the inside of an electronic device 101, according to an embodiment. FIG. 6 is a view illustrating the state in which a hinge structure 540 is removed in the embodiment illustrated in FIG. 5, according to an embodiment. In the embodiments illustrated in FIGS. 5 and 6, the inside of the electronic device is enlarged to focus on the flexible connection member 450 when a plurality of components illustrated in FIG. 4 (e.g., the flexible connection member 450 and the foldable housing 420) are coupled.

In FIGS. 5 and 6, the foldable housing 501 includes a first housing 510 and a second housing 520. Here, the first housing 510 and the second housing 520 may be cover portions that surround a first housing structure 310 and a second housing structure 320, respectively.

Referring to FIG. 5, the flexible connection member 550 may be placed across at least a portion of the inside of the first housing structure 310 and at least a portion of the inside of the second housing structure 320. Here, the phrase "the flexible connection member 550 is placed across the inside of a housing structure" may mean that the flexible connection member 550, having a relatively long elongated shape, is disposed above or below the housing structure. As described above, the housing structure may include a housing and may be assembled in a configuration including at least one of a bracket assembly, a printed circuit board, and a battery disposed inside the housing. Accordingly, the phrase "the flexible connection member 550 is placed across at least a portion of the inside of the housing structure" may mean the flexible connection member 550 is placed across at least some of the components included in the housing structure. For example, the flexible connection member 550 may be placed across at least a portion of a first bracket assembly 523 and at least a portion of a second bracket assembly 524.

Referring to FIGS. 5 and 6 together, when viewing the inside of the foldable housing 501 from above, at least a portion of the flexible connection member 550 may be covered by the hinge structure 540. The portion H covered by the hinge structure 540 is a portion which corresponds to the hinge space, and in which movement (e.g., bending) repeatedly occurs in the flexible connection member 550 during the unfolding and folding operation of the foldable electronic device.

The flexible connection member 550 included in the foldable electronic device may include a plurality of flexible connection members 551 and 552. At least a portion of the flexible connection member 550 may be placed across the inside of the first housing structure including the first housing 510, the first bracket assembly 523, and the first printed circuit board 531, and another portion may be placed across the inside of the second housing structure including the second housing 520 and the second bracket assembly 524. FIGS. 5 and 6 are illustrated in the state in which the second printed circuit board is illustrated. The flexible connection member 550 may be placed on the first housing structure and the second housing structure across the hinge structure 540. In this case, a portion of the flexible connection member 550 may be configured to pass through the opening 540h in the hinge structure 540.

The plurality of flexible connection members 551 and 552 will be described later in detail in the embodiment of FIG. 10 below.

Hereinafter, the movement of the flexible connection member 550 in the hinge space will be described with reference to FIGS. 7 and 8. Here, the dashed-dotted line B-B' represents a virtual surface perpendicular to the folding axis A-A' illustrated in FIGS. 5 and 6.

Figure 7:
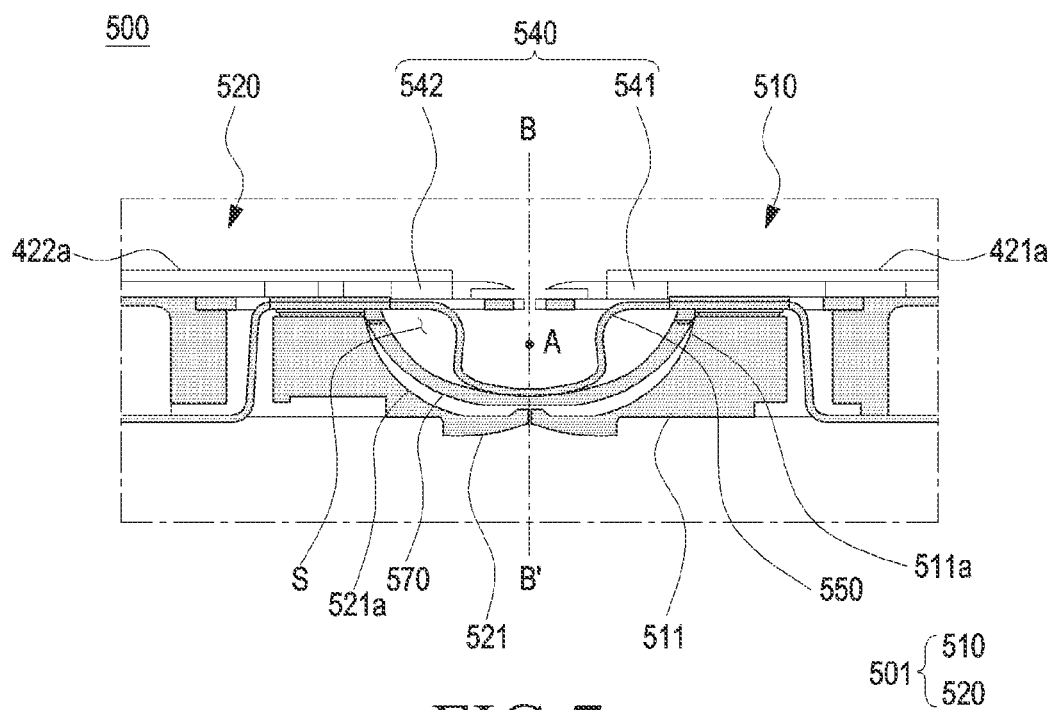
FIG. 7 is a cross-sectional view illustrating the hinge structure and the flexible connection member in the state in which the electronic device is unfolded, according to an embodiment.

FIG. 7 is a cross-sectional view illustrating the hinge structure 540 and the flexible connection member 660 in the state in which the electronic device 500 is unfolded, according to an embodiment. FIG. 8 is a cross-sectional view illustrating the hinge structure 540 and the flexible connection member 550 in the state in which the electronic device is folded, according to an embodiment.

The operations of the first housing 510 and the second housing 520 and the operations of the hinge structure 540 and the flexible connection member 550 according to the states of the electronic device 500 (e.g., the unfolded state, the folded state, and the intermediate state) will be described.

Referring to FIG. 7, when the electronic device 500 is in the unfolded state, the first surface 421a of the first housing 510 and the third surface 422a of the second housing 520 may be disposed to face the same direction while forming an angle of about 180 degrees. The surface of the first area 201 and the surface of the second area 202 of the display may form an angle of about 180 degrees therebetween, and may face the same direction (e.g., the front direction of the electronic device). A folding area 203 formed between the first area 201 and the second area 202 may form the same plane as the first area 201 and the second area 202.

Figure 8:
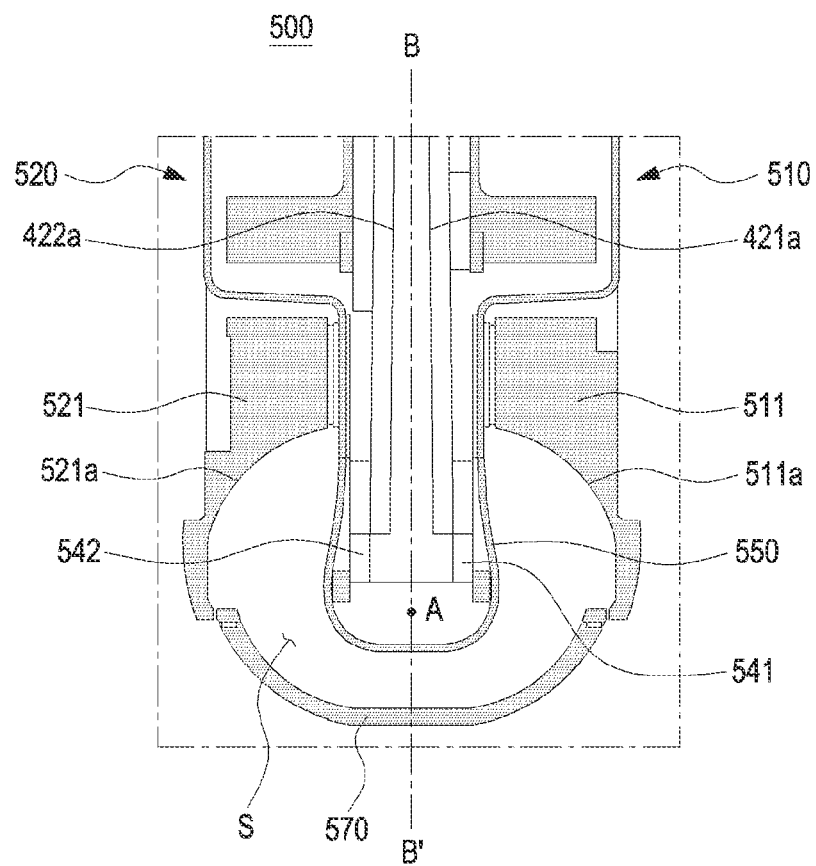
FIG. 8 is a cross-sectional view illustrating the hinge structure and the flexible connection member in the state in which the electronic device is folded, according to an embodiment.

Referring to FIG. 8, when the electronic device 500 is in the folded state, the first surface 421a of the first housing 510 and the second surface 422a of the second housing 520 are be disposed to face each other. The first surface 421a and the second surface 422a may form an acute angle (e.g., an angle between about 0 degrees and 10 degrees) with reference to a virtual plane B-B' perpendicular to the folding axis A-A'. The surface of the first area 201 and the surface of the second area 202 of the display may also face each other while forming a narrow angle (e.g., an angle between about 0 degrees and 10 degrees) relative to each other. At least a portion of the folding area 203 may have a curved surface having a predetermined curvature.

Referring to FIG. 8, an embodiment in which the electronic device 500 illustrated in FIG. 3B is in an intermediate state will be described. The first surface 421a of the first housing 510 and the second surfaces 422a of the second housing 520 may be disposed at a certain angle to each other. The surface of the first area 201 and the surface of the second area 202 of the display 200 may form an angle greater than that in the folded state and smaller than that in the unfolded state. At least a portion of the folding area 203 may have a curved surface having a predetermined curvature, and the curvature at this time may be smaller than that in the folded state.

Referring to FIGS. 7 and 8 together, the hinge structure 540 includes a first hinge structure 541 and a second hinge structure 542. Each of the first hinge structure 541 and the second hinge structure 542 may include a hinge plate. The first hinge structure 541 may support at least a portion of the flexible connection member 550, and the second hinge structure 542 may also support at least a portion of the flexible connection member 550. In the above structure, the hinge structure 540 may be coupled with the hinge cover 570 so as to define a hinge space S, which is at least partially surrounded by the hinge structure 540 and the hinge cover 570. At least a portion of the flexible connection member 550 may be disposed in the hinge space S.

The first housing 510 may include a first rotation support 511 coupled to one side of the hinge cover 570, and the second housing 520 may include a second rotation support 521 coupled to the other side of the hinge cover 570. The first rotation support 511 may include a first rotation support surface 511*a*, and the second rotation support 521 may include a second rotation support surface 521*a*. The first rotation support surface 511*a* and the second rotation support surface 521*a* face each other, and may operate symmetrically with respect to the virtual surface B-B'. Each of the first rotation support surface 511*a* and the second rotation support surface 521*a* may include a curved surface corresponding to the curved surface included in the hinge cover 570.

When the electronic device 500 is in the unfolded state (e.g., the embodiment illustrated in FIG. 7), the first rotation support surface 511*a* and the second rotation support surface 521*a* may cover the hinge cover 570 so that the hinge cover 570 cannot be exposed to the rear surface of the electronic device 500 or can be minimally exposed to the rear surface of the electronic device 101. When the electronic device 500 is in the folded state (e.g., the embodiment illustrated in FIG. 8), the first rotation support surface 511*a* and the second rotation support surface 521*a* may rotate along the curved surfaces included in the hinger cover 570 so that the hinge cover 570 can be exposed to the rear surface of the electronic device 500.

Figure 9:
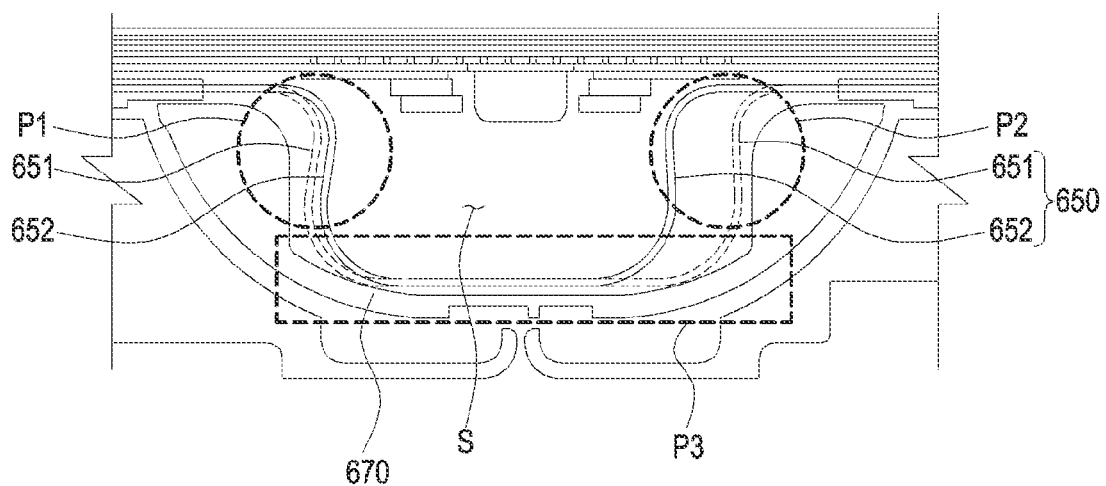
FIG. 9 is a view illustrating a designated shape of a flexible connection member, in the state in which the electronic device is unfolded, according to an embodiment.

FIG. 9 is a view illustrating a disturbed (e.g., appearing irregular) designated shape of a flexible connection member 650 in a state in which the electronic device is unfolded.

Referring to FIG. 9, a shape of the flexible connection member 650 in the hinge space S may be disturbed due to repeated operations of folding and unfolding the foldable electronic device. The phrase "the designated shape is disturbed" may include a case where the designated shape of the flexible connection member 650 is permanently deformed, or a case where the shape of the flexible connection member 650 is deformed due to the foldable electronic device being repeatedly folded and unfolded.

According to the example in which the designated shape is disturbed, when a plurality of flexible connection members are disposed in the hinge space S, the designated shape of each flexible connection member 650 may be more easily disturbed, and disturbance of the designated shape of any one flexible connection member may affect the signal transmission performance and service life of other flexible connection members.

Referring to FIG. 9, two flexible connection members 651 and 652 are illustrated as the plurality of flexible connection members disposed in the hinge space S. When the designated shapes of two flexible connection members 651 and 652 are not maintained in the state in which the electronic device is unfolded, at one side P1 of the hinge side S, the flexible connection members 651 and 652 may be in excessively close contact with a structure (e.g., the hinge cover 670) side of the foldable electronic device. On the other side P2, at least one of the flexible connection members 651 and 652 may be in excessively close contact with the structure (e.g., the hinge cover 670) side of the foldable electronic device, and may be spaced apart from the other flexible connection member. If the designated shapes of the two flexible connection members 651 and 652 are not maintained, the shapes of the flexible connection members 651 and 652 at one side P1 and the shapes of the flexible connection members 651 and 652 at the other side P2 may be different from each other. In addition, in another portion P3, the flexible connection members 651 and 652 may rub against the structure (e.g., the hinge cover 670) of the foldable electronic device in the state in which the electronic device is unfolded, which may result in damage or rapid reduction of the service life due to accumulated stress.

In the following description, various embodiments for preventing the designated shape of the flexible connection members from being disturbed will be described.

First, various embodiments of a flexible connection member 550 will be described. FIG. 10 is a view illustrating flexible connection members, according to an embodiment.

Figure 10:
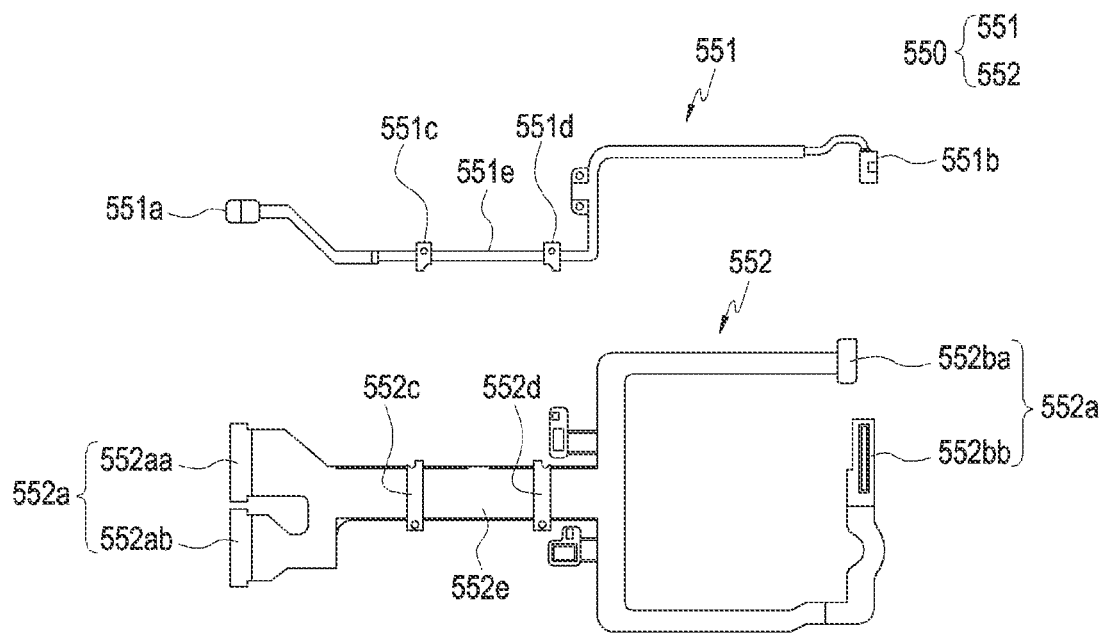
FIG. 10 is a view illustrating flexible connection members, according to an embodiment.

Referring to FIG. 10, the flexible connection member 550 may include a plurality of flexible connection members. For example, the flexible connection member 550 may include a first flexible connection member 551 and a second flexible connection member 552. Further, the flexible connection member 550 may further include three or more flexible connection members.

In FIG. 10, the first flexible connection member 551 and the second flexible connection member 552 are completely separated from each other and illustrated as two separate flexible connection members.

Substantially one flexible connection member may be divided into a first flexible connection member 551 and a second flexible connection member 552. For example, substantially one flexible connection member, which is not physically divided, may be divided into a first flexible connection member 551 and a second flexible connection member 552 according to types of signal lines, and may be branched into two or more branches in only some of the areas in which the flexible connection member is located. The first flexible connection member 551 and the second flexible connection member 552 may have a form of an integrated flexible connection member inside the first housing structure 310, and may be branched into two different flexible connection members 551 and 552 inside the second housing structure 320. As described above, it should be noted that the shape of the flexible connection member may be variously set in different embodiments. In the following description, for convenience of description, a case where two flexible connection members 551 and 552, which are physically spaced apart from each other and have different shapes, will be described, but it should be noted that the scope of the disclosure is not necessarily limited thereto.

Referring to FIG. 10, the first flexible connection member 551 may be placed across at least a portion of the inside of the first housing structure 310 and at least a portion of the second housing structure 320. The second flexible connection member 552 may also be placed across at least a portion of the first housing structure 310 and at least a portion of the second housing structure 320.

Each of the first and second flexible connection members 551 and 552 may include a means so as to be connected to a first printed circuit board 431 or a second printed circuit board 432. The first flexible connection member 551 may electrically connect the first printed circuit board 431 and the second printed circuit board 432 to each other via connection ends 551*a* and 551*b* disposed at the opposite ends thereof. The second flexible connection member 552 may also electrically connect the first printed circuit board 431 and the second printed circuit board 432 to each other via connection ends 552*a* and 552*b* disposed at the opposite ends thereof. Here, the connection ends may each include a receptacle or a header in which at least one pin is formed. The first and second flexible connection members 551 and 552 may be connected to at least one of the first printed circuit board and the second printed circuit board via various other means as well as a receptacle or header structure. For example, the flexible connection members 551 and 552 may be connected at least one of the first printed circuit board 431 and the second printed circuit board 432 via a bonding part formed through a hot-bar process using thermocompression. The shapes of the connection ends and the manufacturing method therefor are not limited to any specific configuration. Based on the shapes of the connection ends, the first and second flexible connection members 551 and 552 may include, for example, a flexible printed circuit (FPC) or a flexible flat cable (FFC) type connector structure, a board to bard (B to B) type connector structure, a zip type connector structure, a bonding type connector structure formed through a hot-bar process, a low insertion force (LIF) connector structure, or a zero insertion force (ZIF) connector structure.

Each of the first and second flexible connection members 551 and 552 may include at least one electrically conductive path connecting the first printed circuit board 431 and the second printed circuit board 432 to each other. Power or a control signal provided from a power management module or a processor may be transmitted via the electrically conductive path. The flexible connection members 551 and 552 may each include an RF wire, which is a high-frequency signal line, as the electrically conductive path for transmitting a communication signal provided from an RF transceiver or a communication signal received via a communication device to another RF transceiver. For example, the first flexible connection member 551 may include a wire (or a conductive path) for transmitting a communication signal including an RF signal. In addition, the second flexible connection member 552 may include a wire for transmitting an electrical signal that is less sensitive to an impedance change than a wire included in the first flexible connection member 551. The second flexible connection member 552 may include a power wire. The second flexible connection member 552 may include a wire for transmitting data and/or a wire for transmitting a control signal (an electrically conductive path) in addition to or instead of the power wire. The first flexible connection member 551 may be formed to be thinner and narrower than the second flexible connection member 552, depending on RF signal characteristics. Therefore, when the first flexible connection member 551, including a conductive path for transmitting an RF signal, is repeatedly used in the state in which a designated shape thereof is disturbed in the hinge space, the durability thereof will be relatively weak compared to the second flexible connection member 552, and it may be difficult to exhibit smooth communication performance because the first flexible connection member 551 is vulnerable to a change in impedance.

Figure 11:
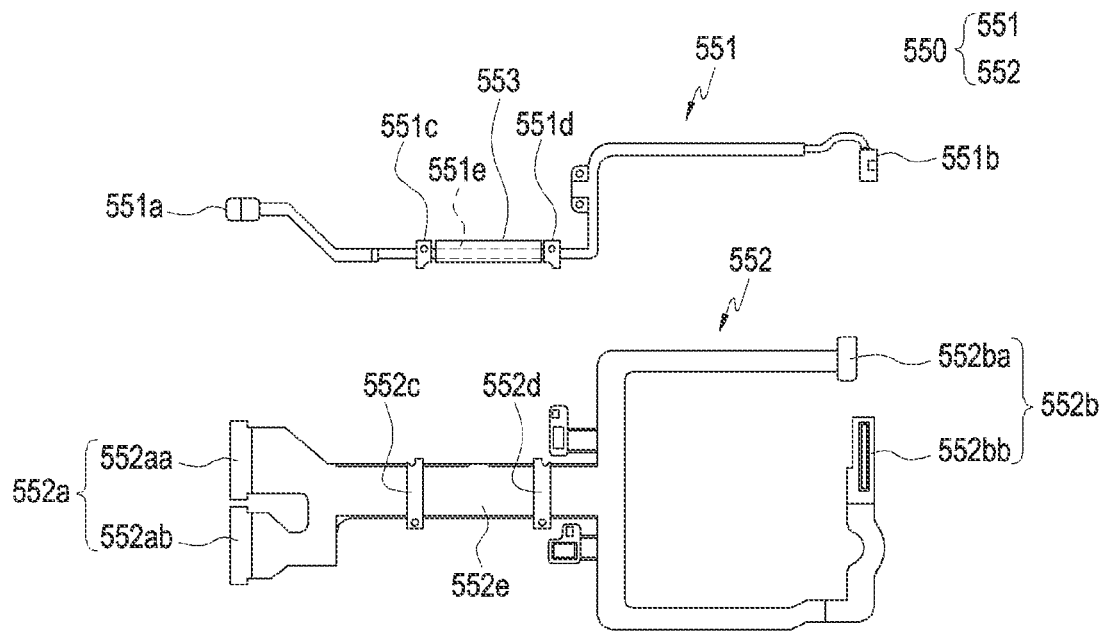
FIG. 11 is a view illustrating flexible connection members and an adhesive member, according to an embodiment.

FIG. 11 is a view illustrating flexible connection members and an adhesive member, according to an embodiment.

Referring to FIG. 11, a foldable electronic device includes an adhesive member 553 attached to the first flexible connection member 551. The adhesive member 553 may be a component for making the first flexible connection member 551 maintain the shape thereof constant within a designated area while the foldable housing 300 is being folded and unfolded. Tape (e.g., non-conductive tape) may be used as the adhesive member 553. The first flexible connection member 551 and the second flexible connection member 552 may maintain the designated shapes thereof by the adhesive member 553 even when the foldable electronic device is repeatedly folded and unfolded.

The adhesive member 553 may be disposed to cover at least a partial area of the first flexible connection member 551. Here, a portion 450c (or a "flexible portion") of the flexible connection member described with reference to FIG. 4 may correspond to the "at least a partial area" of the first flexible connection member 551.

Each portion of the flexible connection member will be described. Referring to FIGS. 10 and 11 together, the first flexible connection member 551 may include, along the longitudinal direction of the first flexible connection member 551, a rigid portion 551c fixed to the first housing structure 310 side, a rigid portion 551d fixed to the second housing structure 320, and a flex portion 551e between the rigid portions 551c and 551d. The second flexible connection member 552 may include, along the longitudinal direction of the flexible connection member 551, a rigid portion 552c fixed to the first housing structure 310 side, a rigid portion 552d fixed to the second housing structure 320, and a flex portion 552e between the rigid portions 552c and 552d. Here, the phrase "the rigid portions 551c and 551d of the first flexible connection member 551 are fixed to the first housing structure side and the second housing structure side" may include a case where the rigid portion 551c of the first flexible connection member 551 is fixed to a first hinge structure 441, a first printed circuit board 431, or a first bracket assembly 423 disposed inside the first housing structure 310. The rigid portion 551d of the first flexible connection member 551 may be fixed to a second hinge structure 442, a second printed circuit board 432, or a second bracket assembly 424 disposed inside the second housing structure 320. The phrase "the rigid portions 552c and 552d of the second flexible connection member 552 are fixed to the first housing structure side and the second housing structure side" may be similarly applied to an embodiment in which the rigid portions 551c and 551d of the first flexible connection member 551 are fixed to the first housing structure side and the second housing structure side.

The flex portions 551e and 552e may be portions that are movable in a space (e.g., the hinge space S in FIG. 7) inside the hinge structure. The adhesive member 553 may be stacked on the flex portion 551e of the first flexible connection member 551, and may guide the flex portion 551e to be movable within a designated area (e.g., the hinge space S) while maintaining the shape (and/or the position) thereof constant.

The first flexible connection member 551 may include a cover layer so as to increase the rigidity of the first flexible connection member 551, and thus to maintain the designated shape of the flexible connection member 551. However, when a cover layer is added to the first flexible connection member 551, the flexibility of the flex portion 551e may decrease. Accordingly, an embodiment of maintaining the designated shape of the first flexible connection member 551 without a cover layer using the adhesive member 553 may be provided.

Figure 12:
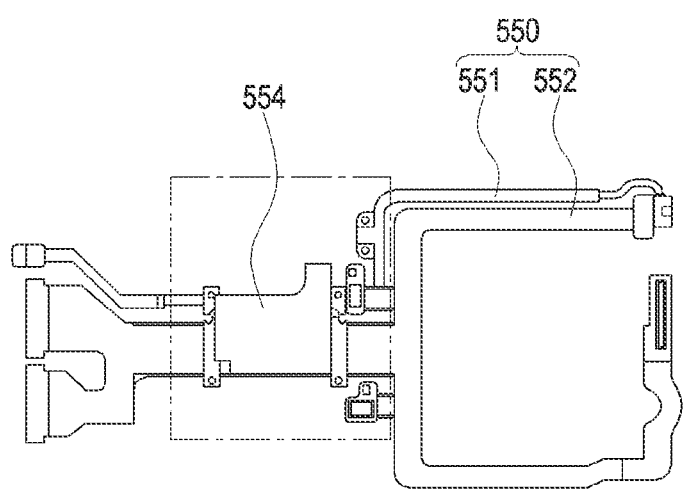
FIG. 12 is a view illustrating flexible connection members and an adhesive member connecting the flexible connection members, according to an embodiment.
Figure 13:
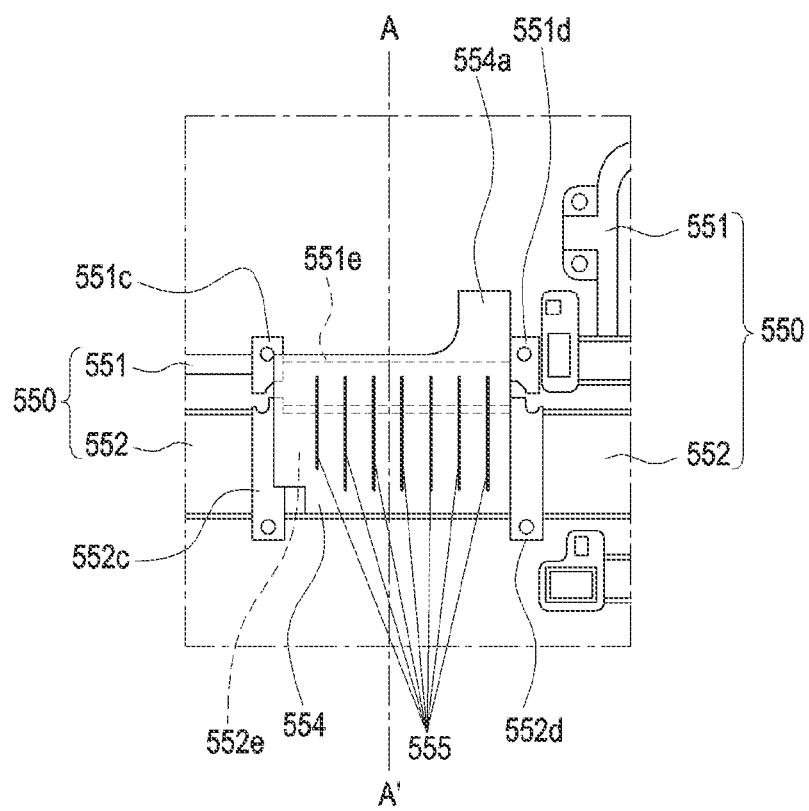
FIG. 13 is a view illustrating the state in which one or more slits are formed in an adhesive member, according to an embodiment.

FIG. 12 is a view illustrating flexible connection members and an adhesive member 554 connecting the flexible connection members, according to an embodiment. FIG. 13 is a view illustrating the state in which one or more slits 555 are formed in the adhesive member 554, according to an embodiment.

Referring to FIG. 12, the foldable electronic device includes an adhesive member 554 connecting the flexible connection members 551 and 552 to each other. The adhesive member 554 may be a component configured to fix the positions of two different flexible connection members 551 and 552 together, and to constantly maintain the designated shapes (and/or positions) of the first flexible connection member 551 and the second flexible connection member 552 within a designated area while the foldable housing 300 is being folded and unfolded. The adhesive member 554 may serve to connect the first flexible connection member 551 and the second flexible connection member 552 like a single flexible connection member.

The first flexible connection member 551 and the second flexible connection member 552 may be connected to each other using tape as the adhesive member 554. The first flexible connection member 551 and the second flexible connection member 552 may maintain the designated shapes thereof by the adhesive member 554 even when the foldable electronic device is repeatedly folded and unfolded.

Referring to FIG. 13, the adhesive member 554 may be disposed to cover at least a partial area of the first flexible connection members 551 and 552. Here, a portion (or a "flexible portion") 450c of the flexible connection member described above with reference to FIG. 4 may correspond to the "at least a partial area" of the flexible connection members 551 and 552. Hereinafter, with respect to each portion of the adhesive member 554, a description of a portion overlapping the description of FIG. 11 will be omitted.

The flex portions 551e and 552e may be portions that are movable in a space (e.g., the hinge space S in FIG. 7) inside the hinge structure. The adhesive member 554 may be stacked on the flex portion 551e of the first flexible connection member 551 and the flex portion 552 of the second flexible connection member 552, and may guide the flex portions 551e and 552e to be movable within a designated area (e.g., the hinge space S) while maintaining the shapes (and/or the positions) thereof constant.

Referring to FIG. 13, opposite sides of the adhesive member 554 may be connected to the rigid portions 551c and 551d of the first flexible connection member 551 and the rigid portions 552c and 552d of the second flexible connection member 552, respectively. For example, the adhesive member 554 may have a shape that entirely covers the flex portions 551e and 552e. Alternatively, the adhesive member 554 may have a shape covering only a portion of the flex portions 551e and 552e.

The shape of the adhesive member 554 may be variously set. For example, the adhesive member 554 may further include a handle portion 553a, which allows the user to directly attach the adhesive member 554 to the first flexible connection member 551 and the second flexible connection member 552, in addition to the portion that entirely covers the flex portions 551e and 552e.

One or more slits may be formed in the adhesive member 554 to maintain the designated shapes of the flexible connection members 551 and 552. The one or more slits 555 may serve to equalize the movement of the flex portion when the flexible connection members 551 and 552 are bent.

The longitudinal direction of the one or more slits 555 may be parallel to the folding axis A-A' of the electronic device 101. When a plurality of slits are included, the arrangement direction of the plurality of slits may be formed to be perpendicular to the folding axis A-A'.

Figure 14:
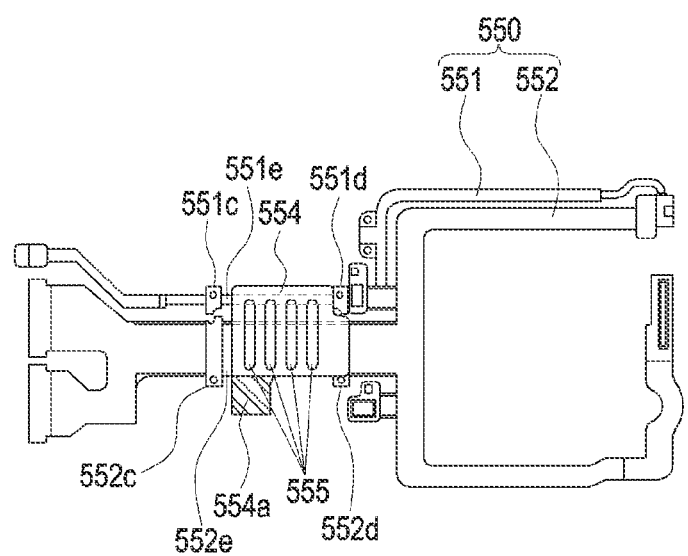
FIG. 14 is a view illustrating the state in which a flexible connection member and an adhesive member are coupled to each other, according to an embodiment.

FIG. 14 is a view illustrating the state in which the flexible connection members 551 and 552 and the adhesive member 554 are coupled to each other, according to an embodiment.

Referring to FIG. 14, in the adhesive member 554, the handle part 554a included in the adhesive member 554 can be disposed at different portions of the adhesive member 554 to form different shapes of the adhesive member 554. In contrast to FIG. 13, only one side of the adhesive member 554 is connected to the rigid portion 551d of the first flexible connection member 551 and the rigid portion 552d of the second flexible connection member 552, and the other side is stacked on the flex portions 551e and 552e in the state of being spaced apart from the rigid portions 551c and 552c by a predetermined distance.

In addition, the shape and/or number of one or more slits 555 provided in the adhesive member 554 may vary. In FIGS. 15A to 15E described below, one or more slits are disclosed, according to various embodiments.

Figure 15A:
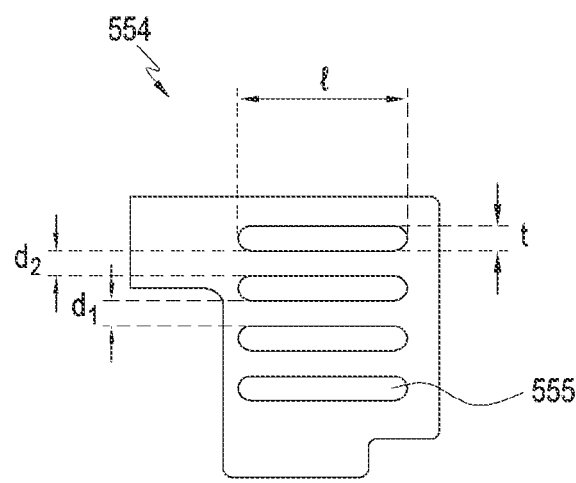
FIG. 15A is a view illustrating a shape of one or more slits, according to an embodiment.
Figure 15B:
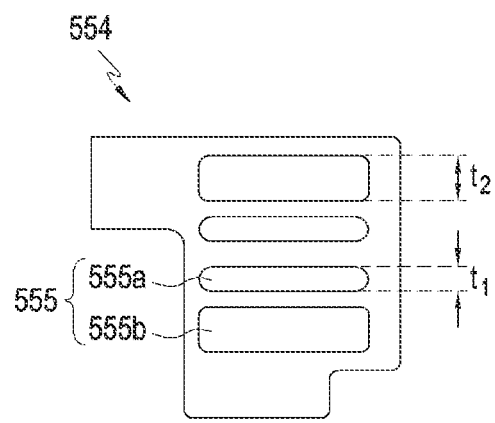
FIG. 15B is a view illustrating a shape of one or more slits, according to an embodiment.
Figure 15C:
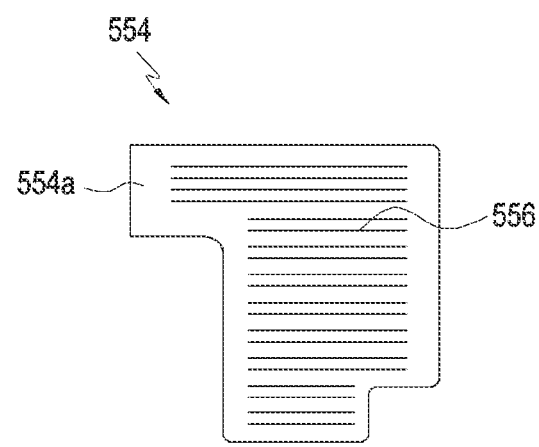
FIG. 15C is a view illustrating a shape of one or more slits, according to an embodiment.
Figure 15D:
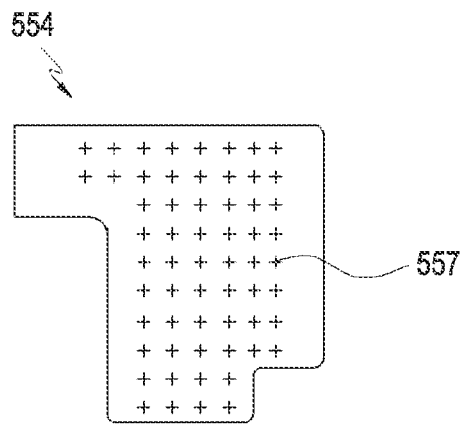
FIG. 15D is a view illustrating a shape of one or more slits, according to an embodiment.
Figure 15E:
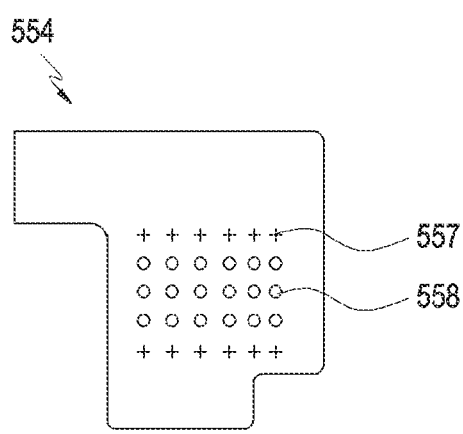
FIG. 15E is a view illustrating a shape of one or more slits, according to an embodiment.

FIG. 15A is a view illustrating a shape of one or more slits 555, according to an embodiment. FIG. 15B is a view illustrating a shape of one or more slits 555, according to an embodiment. FIG. 15C is a view illustrating a shape of one or more slits 556, according to an embodiment. FIG. 15D is a view illustrating a shape of one or more slits 557, according to an embodiment. FIG. 15E is a view illustrating a shape of one or more slits 557 and 558, according to an embodiment.

One or more slits formed in the adhesive member 554 may have various shapes, numbers, and various widths, and lengths. For example, as illustrated in FIG. 15A, a plurality of slits 555 having the same width t and length l may be formed in the adhesive member 553, and the intervals d1 and d2 between the slits may be variously set depending on the positions of the slits provided in the adhesive member 554. Slits close to the center of the adhesive member 554 may have a small interval d1, such that the slits are densely arranged, and slits far from the center may have a relatively great interval d2, such that the density of the slits are arranged relatively sparsely.

Alternatively, as illustrated in FIG. 15B, a plurality of slits 555 having different widths t1 and t2 or different lengths may be formed in the adhesive member 554. For example, narrow slits 555a may be disposed close to the center of the adhesive member 554, and relatively wider slits 555b may be disposed far from the center of the adhesive member 554.

Alternatively, as illustrated in FIG. 15C, the one or more slit 556 may have a very narrow width, like a fine thread shape, and a very long length compared to the width. Some of the one or more slits 556 may extend to the handle portion 554a.

Alternatively, as illustrated in FIG. 15D, cross-shaped patterns may be repeated in the form of at least one slit 557.

Alternatively, as illustrated in FIG. 15E, one or more slits 557 and 558 having two or more different shapes may be used in combination. Among the one or more slits 557 illustrated in FIG. 15E, some slits 557 may employ a cross-shaped pattern, and the other slits 558 may employ an opening-shaped pattern formed through punching.

Additionally, one or more slits may include various embodiments other than that which was described with reference to FIGS. 15A to 15E. When one or more slits are capable of performing a role of making the movement of the flex portion uniform when the flexible connection members 551 and 552 are bent, the slits may include similar patterns, such as holes, grooves, recesses, and openings.

In the above-described embodiments, the adhesive member for maintaining a designated shape when two or more flexible connecting members are bent, and a slit structure formed therein, have been described. Hereinafter, a description will be made focusing on a slit structure for maintaining a designated shape when a multilayer flexible connection member is bent.

Figure 16:
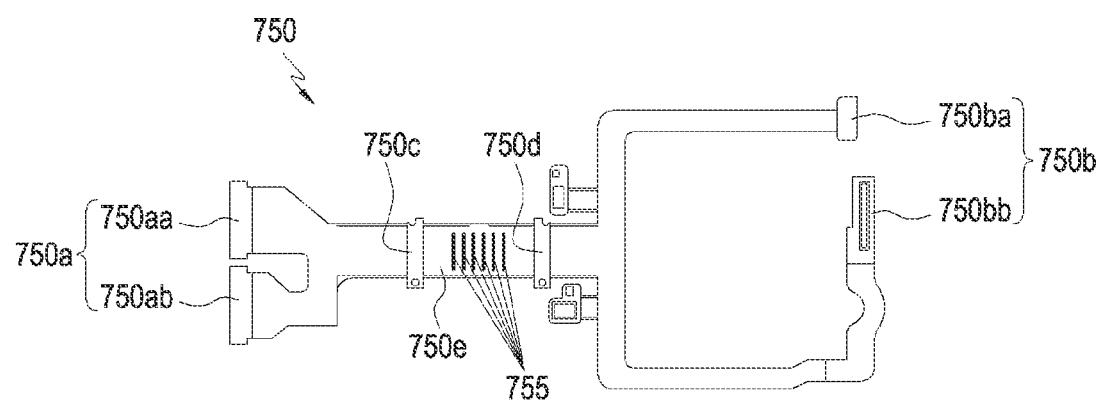
FIG. 16 is a view illustrating a flexible connection member and one or more slits formed in the flexible connection member, according to an embodiment.

FIG. 16 is a view illustrating a flexible connection member 750 and one or more slits 755 formed in the flexible connection member 750, according to an embodiment. FIG.

17 is a conceptual view illustrating a flexible connection member 750 and one or more slits 755 formed in the flexible connection member 750, according to an embodiment. FIG. 18A is a cross-sectional view illustrating the flexible connection member 750 according to the embodiment illustrated in FIG. 17 and one or more slits 755 formed in the flexible connection member, according to an embodiment. FIG. 18B is a cross-sectional view illustrating the flexible connection member 750 and one or more slits 755 and 755' formed in the flexible connection member, according to an embodiment. Here, each of FIGS. 18A and 18B illustrate a cross-sectional view of the flexible connecting member 750 according to the embodiment illustrated in FIG. 17, taken in the direction of line C-C'.

The flexible connection member 750 may be formed of substantially one flexible connection member. Referring to FIG. 16, the flexible connecting member 750 may be made as a single flexible connection member, and includes a plurality of connection ends 750aa, 750ab, 750ba, and 750bb being branched off from at least one of the first housing structure 310 and the second housing structure 320. The flexible connection member 750 illustrated in FIG. 16 may include a plurality of signal lines, and may be implemented as a multilayer circuit board in which a plurality of conductive layers and a plurality of insulating layers are alternately stacked.

Figure 17:
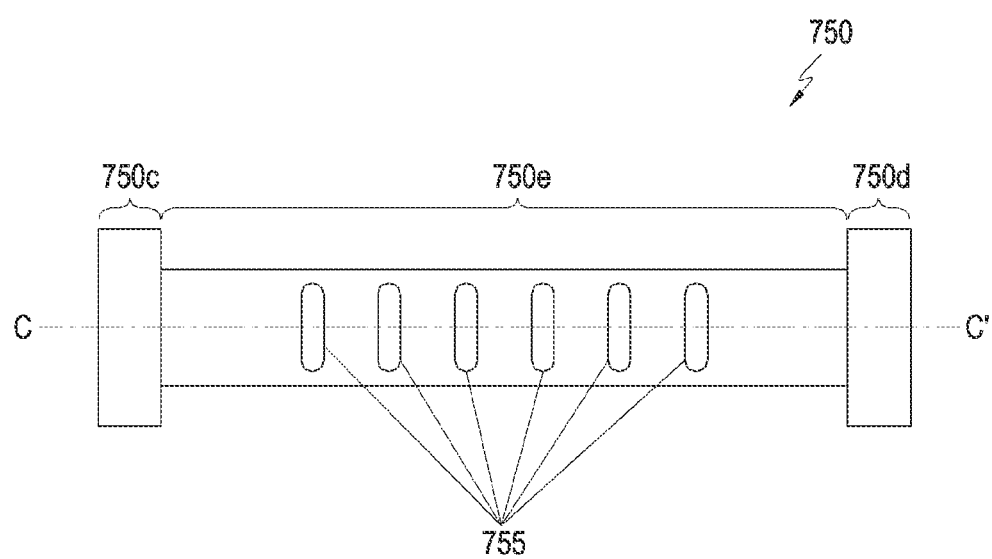
FIG. 17 is a conceptual view illustrating a flexible connection member and one or more slits formed in the flexible connection member, according to an embodiment.
Figure 18A:
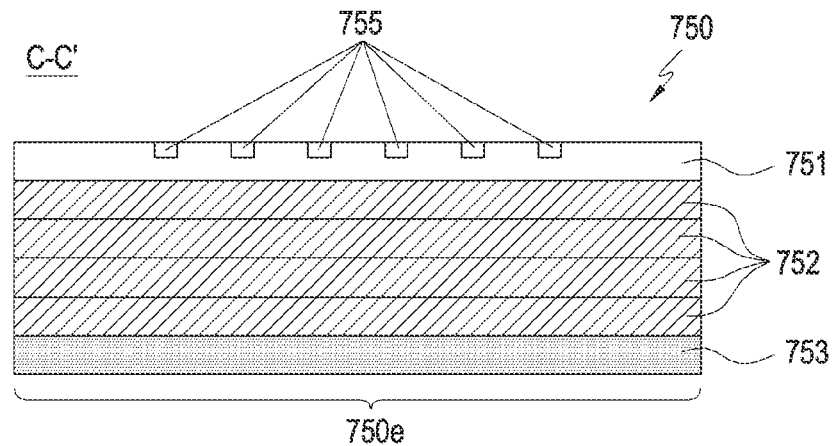
FIG. 18A is a cross-sectional view illustrating the flexible connection member according to the embodiment illustrated in FIG. 17 and one or more slits formed in the flexible connection member, according to an embodiment.
Figure 18B:
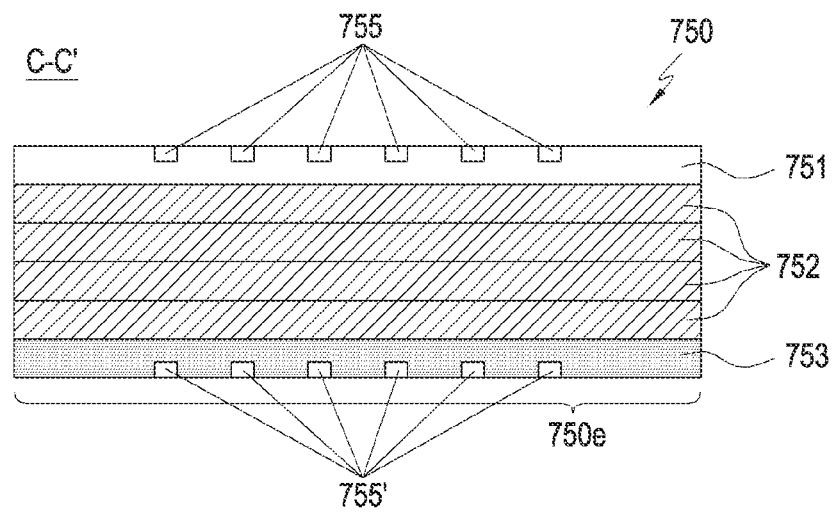
FIG. 18B is a cross-sectional view illustrating the flexible connection member and one or more slits formed in the flexible connection member, according to an embodiment.

Referring to FIG. 17, the flexible connection member 750 includes along the longitudinal direction thereof, rigid portions 750c and 750d fixed to a housing, a bracket assembly, or a printed circuit board. In addition, a flexible portion 750e may be disposed between the rigid portions 750c and 750d. Here, the flex portion 750e may be disposed in a hinge space S at least partially surrounded by a hinge structure 440 and/or a hinge cover 470 when the flexible connection member 750 is mounted inside a foldable housing 420 or a foldable housing structure 330.

Referring to FIGS. 18A and 18B, the flex portion 750e of the flexible connection member 750 has a plurality of layered structures. In addition, at least one slit 755 may be formed in an outermost layer of a plurality of layered structures, for example, the uppermost layer and/or the lowermost layer. FIG. 18A illustrates a plurality of slits 755 formed in the uppermost layer of the flexible connection member 750. As illustrated in FIG. 18B, a plurality of slits 755 may be formed in the uppermost layer of the flexible connection member 750, and a plurality of slits 755' may be formed in the lowermost layer as well.

The flexible connection member 750 may include, as a plurality of layered structures, a plurality of conductive layers and a plurality of insulating layers. The plurality of conductive layers and the plurality of insulating layers included in the flex portion 750e may integrally extend from the rigid portions 750c and 750d. The flex portion 750 may include a first cover layer 751, a stacked structure 752 of at least one conductive layer and at least one insulating layer, and a second cover layer 753. Here, the stacked structure 752 of at least one conductive layer and at least one insulating layer may be a first conductive layer, a first insulating layer, a second conductive layer, and a second insulating layer stacked in order. At least a portion of the flexible connection member 750 (e.g., the top surface of the first conductive layer) may be visible to the outside, and may be covered by the first cover layer 751. Similarly, the lower end of the flexible connection member 750 may also be covered by the second cover layer 752. By forming slits 755 in at least one of the first cover layer 751 and the second cover layer 753, for example, by forming one or more slits in a portion corresponding to a hinge structure (or a hinge space) in a multilayer flexible connection member, it is possible to maintain a designated shape when the multilayer circuit board is bent. Accordingly, it is possible to improve the service life of the flexible connection member.

One or more slits 755 may also be formed in a direction parallel to the folding axis A-A'. In addition, the one or more slits 755 may also have various shapes, numbers, and various widths and lengths similar to the slits formed in an adhesive member 553.

Figure 19:
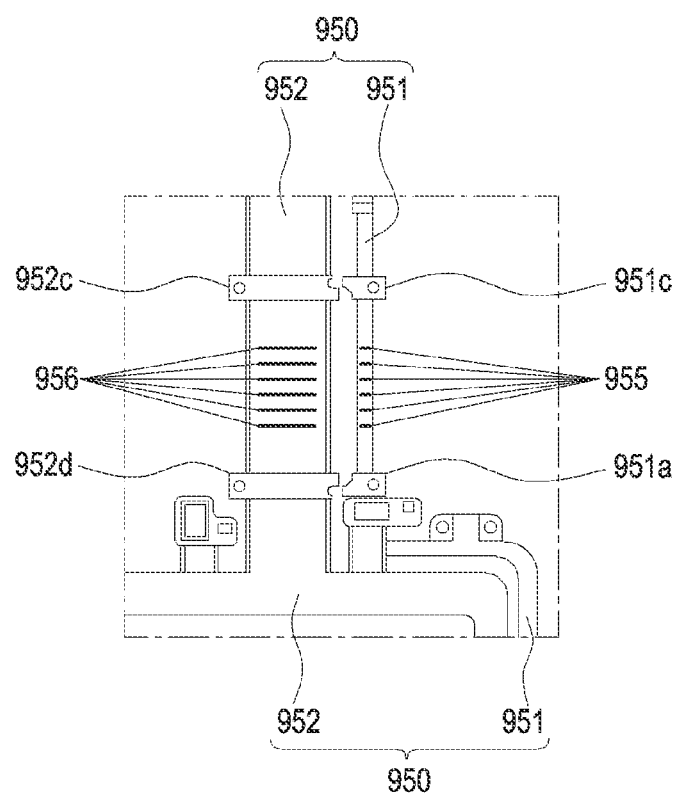
FIG. 19 is a view illustrating a flexible connection member and one or more slits formed in the flexible connection member, according to an embodiment.

FIG. 19 is a view illustrating a flexible connection member 950 and one or more slits formed in the flexible connection members 951 and 952, according to an embodiment.

Referring to FIG. 19, multilayer flexible connection member includes a first multilayer flexible connection member 951 placed across at least a portion of a first housing structure 310 and at least a portion of a second housing structure 320 and configured to electrically connect a first printed circuit board 431 and a second printed circuit board 432 via connection ends located at the opposite ends thereof, and a second multilayer flexible connection member 952 placed across at least a portion of the first housing structure 310 and at least a portion of the second housing structure 320 and configured to electrically connect the first printed circuit board 431 and the second printed circuit board 432 via connection ends disposed at the opposite ends thereof.

One or more slits 955 and 956 may be formed in each of the first multilayer flexible connection member 951 and the second multilayer flexible connection member 952. The one or more slits 955 and 956 may be formed in at least one of the uppermost layer and the lowermost layer of the first multilayer flexible connection member 951, and may be formed in at least one of the uppermost layer and the lowermost layer of the second multilayer flexible connection member 951. The one or more slits 955 and 956 may be formed in a portion of at least one of the uppermost layer and the lowermost layer of the first multilayer flexible connection member 951, for example, between the rigid portions 951c, 952c, 951d, and 952d.

As illustrated in FIG. 19, when a plurality of multilayer flexible connection members are provided, it is possible to maintain the designated shapes of the multilayer flexible connection members by forming one or more slits in each of the multilayer flexible connection members.

In the case where a plurality of flexible connection members are provided in a foldable housing, the method of maintaining the designated shape using the adhesive member 553 described above with reference to FIGS. 10 to 15E, and the method of directly forming the slits in the multilayer flexible connection member described above with reference to FIGS. 16 to 18B may be applied together.

Figure 20:
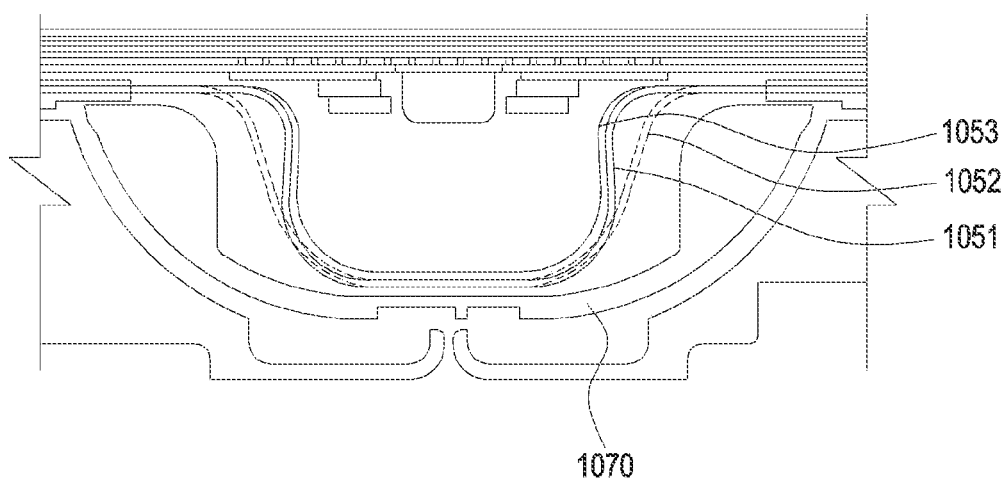
FIG. 20 is a view illustrating the state in which a designated shape of a flexible connection member is maintained when the foldable electronic device is unfolded, according to an embodiment.

FIG. 20 is a view illustrating the state in which the designated shape of a flexible connection member 1051 is maintained when a foldable electronic device is unfolded, according to an embodiment.

Referring to FIG. 20, when the adhesive member 1053 is attached to the first flexible connection member 1051, it can be seen that the designated shape of the first flexible connection member 1051 is maintained even if the foldable electronic device is repeatedly folded and unfolded.

Comparing FIG. 20 with FIG. 9, it can be seen that the uniformity of the designated shape of the first flexible connection member 1051 in the embodiment illustrated in FIG. 20 is significantly improved compared to the embodiment illustrated in FIG. 9. For example, in the embodiment illustrated in FIG. 20, it can be seen that the designated shape of the first flexible connection member 1051 is not disturbed in the portion corresponding to P1 in FIG. 9. In addition, in the embodiment illustrated in FIG. 20, it is possible to prevent or significantly reduce friction with a structure (e.g., the hinge cover 1070) of the foldable electronic device.

Figure 21:
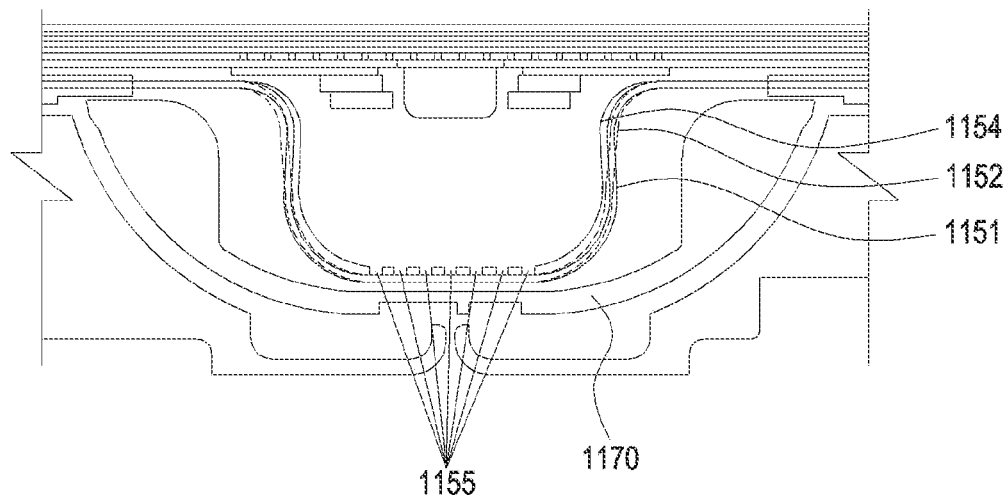
FIG. 21 is a view illustrating the state in which a designated shape of a flexible connection member is maintained when the foldable electronic device is unfolded, according to an embodiment.

FIG. 21 is a view illustrating the state in which the designated shapes of flexible connection members 1151 and 1152 are maintained when a foldable electronic device is unfolded, according to an embodiment.

Referring to FIG. 21, when an adhesive member 1154 is attached on the two different flexible connection members 1151 and 1152, the designated shapes of the flexible connection members 1151 and 1152 are maintained even when the foldable electronic device is repeatedly folded and unfolded. In addition, by forming a plurality of slits 1155 in the adhesive member 1154, it is possible to further improve the uniformity of the designated shapes of the flexible connection members 1151 and 1152. When FIG. 21 is compared with FIG. 9, it can be seen that the uniformity of the designated shapes of the first and second flexible connection members 1151 and 1152, in the embodiment illustrated in FIG. 21, is significantly improved compared to the embodiment illustrated in FIG. 9. For example, in the embodiment illustrated in FIG. 21, it can be seen that the designated shapes of the first and second flexible connection members 1151 and 1152 are not disturbed in the portion corresponding to P1 in FIG. 9. In addition, in the embodiment illustrated in FIG. 21, it is possible to prevent or significantly reduce friction with a structure (e.g., the hinge cover 1170) of the foldable electronic device.

Figure 22:
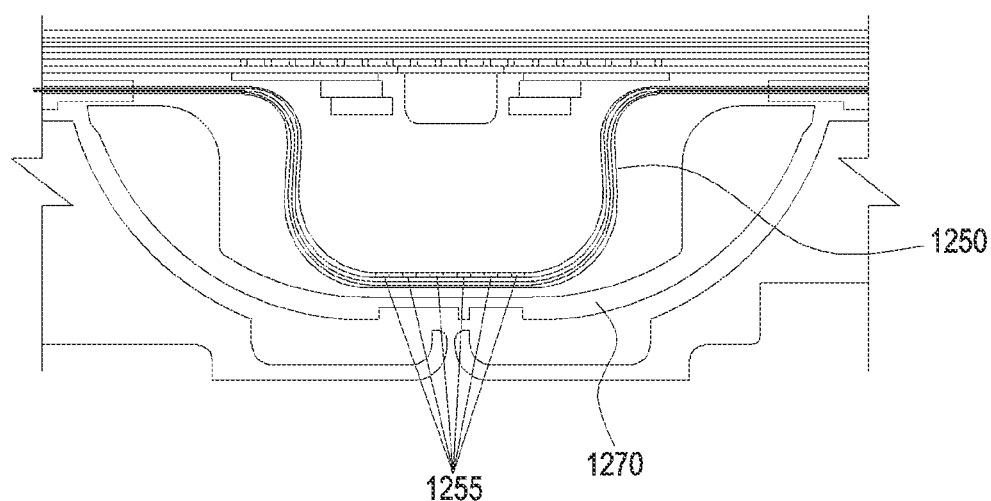
FIG. 22 is a view illustrating the state in which a designated shape of a flexible connection member is maintained when the foldable electronic device is unfolded, according to an embodiment.

FIG. 22 is a view illustrating the state in which the designated shape of a flexible connection member 1250 is maintained when a foldable electronic device is unfolded, according to an embodiment.

Referring to FIG. 22, the flexible connection member 1250 is a multilayer flexible connection member 1250. When the foldable electronic device is repeatedly folded and unfolded, a laminated portion of the multilayer flexible connection member 1250 may be separated and the designated shape may be disturbed. In order to prevent this, by forming one or more slits 1255 in at least one of the outermost layers of the multilayer flexible connection member 1250, as described above, it can be seen that the designated shape of the multiple flexible connection member 1250 is maintained even when the foldable electronic device is repeatedly folded and unfolded. For example, in the embodiment illustrated in FIG. 22, it can also be seen that the designated shape of the first flexible connection member 1250 is not disturbed. In addition, in the embodiment illustrated in FIG. 22, it is also possible to prevent or significantly reduce friction with a structure (e.g., the hinge cover 1270) of the foldable electronic device.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment, a foldable electronic device includes a hinge structure; a foldable housing including a folding area in which the electronic device is substantially folded about a folding axis, the foldable housing including a first housing structure connected to the hinge structure, the first housing structure including a first surface facing in a first direction and a second surface facing in a second direction opposite the first direction, and a first printed circuit board on which a plurality of electronic components are mounted; and a second housing structure connected to the hinge structure, the second housing structure including a third surface facing in a third direction and a fourth surface facing in a fourth direction opposite the third direction, and a second printed circuit board on which a plurality of electronic components are mounted, the second housing structure being folded about the hinge structure relative to the first housing structure; a flexible display disposed inside the foldable housing and extending from the first surface of the first housing structure to the third surface of the second housing structure; a first flexible connection member placed across at least a portion of an inside of the first housing structure and at least a portion of an inside of the second housing structure, and configured to electrically connect the first printed circuit board and the second printed circuit board via connection ends disposed at opposite ends thereof, the first flexible connection member including a wire configured to transmit a communication signal including an RF signal; a second flexible connection member placed across at least a portion of an inside of the first housing structure and at least a portion of an inside of the second housing structure, and configured to electrically connect the first printed circuit board and the second printed circuit board via connection ends disposed at opposite ends thereof, the first flexible connection member including a power wire; and an adhesive member attached to the first flexible connection member so as to make the first flexible connection member maintain a shape thereof constant within a designated area while the foldable housing is being folded and unfolded.

The adhesive member may be provided on each of a top surface and a bottom surface of the first flexible connection member.

The adhesive member may be attached to at least a portion of the first flexible connection member and may include a portion extending from a portion attached to the at least a portion of the first flexible connection member and attached to the second flexible connection member, thereby connecting the first flexible connection member and the second flexible connection member.

Each of the first flexible connection member and the second flexible connection member may include, along a longitudinal direction thereof, rigid portions to be respectively fixed to a side of the first housing structure and a side of the second housing structure, and a flex portion disposed between the rigid portions.

The flexible portion may be configured to be movable in a space inside the hinge structure.

The adhesive member may be stacked on the flex portion of the first flexible connection member and the flex portion of the second flexible connection member.

At least one of the opposite sides of the adhesive member may be connected to the rigid portions of the first flexible connection member and the second flexible connection member.

The first flexible connection member and the second flexible connection member may be branched off from substantially one flexible connection member.

The first flexible connection member or the second flexible connection member may include an RF wire.

The one or more slits may be formed in a direction parallel to the folding axis.

A plurality of slits may be provided, and the plurality of slits may be disposed to be spaced apart from each other in larger intervals as a distance from the center of the folding axis increases.

A plurality of slits may be provided, and the width of a slit located far from the center of the folding axis may be larger than the width of a slit located close to the center of the folding axis.

According to an embodiment, a foldable electronic device includes a hinge structure; a foldable housing including a folding area in which the electronic device is substantially folded about a folding axis, the foldable housing including a first housing structure connected to the hinge structure, the first housing structure including a first surface facing in a first direction and a second surface facing in a second direction opposite the first direction, and a first printed circuit board on which a plurality of electronic components are mounted; and a second housing structure connected to the hinge structure, the second housing structure including a third surface facing in a third direction and a fourth surface facing in a fourth direction opposite the third direction, and a second printed circuit board on which a plurality of electronic components are mounted, the second housing structure being configured to be foldable about the hinge structure relative to the first housing structure, wherein, in a folded state, the first surface faces the third surface and, in an unfolded state, the third direction is the same as the first direction; a flexible display disposed inside the foldable housing and extending from the first surface of the first housing structure to the third surface of the second housing structure; and a multilayer flexible connection member placed across at least a portion of an inside of the first housing structure and at least a portion of an inside of the second housing structure, and configured to electrically connect the first printed circuit board and the second printed circuit board via connection ends disposed at opposite ends thereof, wherein one or more slits are formed in a portion of the multilayer flexible connection member corresponding to the hinge structure.

The one or more slits may be formed in each of an uppermost layer and a lowermost layer of the multilayer flexible connection member.

The multilayer flexible connection member may include, along the longitudinal direction thereof, rigid portions to be respectively fixed to a side of the first housing structure and a side of the second housing structure, and a flex portion disposed between the rigid portions and configured to move in a space inside the hinge structure, and the one or more slits may be formed in the flex portion.

The one or more slits may be formed in a direction parallel to the folding axis.

A plurality of slits may be provided, and the plurality of slits may be disposed to be spaced apart from each other in larger intervals as a distance from the center of the folding axis increases.

A plurality of slits may be provided, and the plurality of slits may be disposed in smaller densities as a distance from the center of the folding axis increases.

A plurality of slits may be provided, and the width of a slit located far from the center of the folding axis may be larger than the width of a slit located close to the center of the folding axis.

The multilayer flexible connection member may include a first multilayer flexible connection member placed across at least a portion of an inside of the first housing structure and at least a portion of an inside of the second housing structure, and configured to electrically connect the first printed circuit board and the second printed circuit board via connection ends disposed at opposite ends thereof, and a second multilayer flexible connection member placed across at least a portion of an inside of the first housing structure and at least a portion of an inside of the second housing structure, and configured to electrically connect the first printed circuit board and the second printed circuit board via connection ends disposed at opposite ends thereof. The one or more slits may be formed in at least one of an uppermost layer and a lowermost layer of the first multilayer flexible connection member, and in at least one of an uppermost layer and a lowermost layer of the second multilayer flexible connection member.

According to various embodiments of the present disclosure, it is possible to maintain a designated shape of a bent portion of the flexible connection member within a designated area by providing the adhesive member.

According to various embodiments of the present disclosure, it is possible to maintain a designated shape of a bent portion of each of the flexible connection members within a designated area by providing an adhesive member connecting at least two different flexible connection members.

According to various embodiments of the present disclosure, it is possible to cause the bent portion of the flexible connection member to be bent more evenly by additionally providing one or more slits in the adhesive member.

According to various embodiments of the present disclosure, it is possible to cause the bent portion of the flexible connection member to be bent more evenly by providing one or more slits in the flexible connection member itself.

According to various embodiments of the present disclosure, it is possible to maintain the designated shape of the bent portion of the flexible connection member by applying the adhesive member or the one or more slits to not only one surface (e.g., the uppermost layer), but also the other surface (e.g., the lowermost layer) of the flexible connection member.

Accordingly, it is possible to improve the service life of a flexible connection member and a foldable electronic device including the same.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. A foldable electronic device comprising:
a foldable housing including a first housing portion, a second housing portion, and a hinge structure connected with the first housing portion and the second housing portion, the foldable housing configured to be folded about a folding axis by the hinge structure;
a flexible display disposed in the first housing portion and the second housing portion;
a plurality of printed circuit boards (PCBs) including a first PCB disposed in the first housing portion and a second PCB disposed in the second housing portion;
a first flexible PCB (FPCB) configured to be connected with the first PCB and the second PCB, the first FPCB including a first flexible portion located in a hinge space provided by at least a portion of the hinge structure;
a second FPCB configured to be connected with the first PCB and the second PCB, the second FPCB including a second flexible portion located in the hinge space; and
an adhesive member adhesively attached to both at least a part of the first flexible portion of the first FPCB and at least a part of the second flexible portion of the second FPCB such that the at least a part of the first flexible portion and the at least a part of the second flexible portion maintain shapes or positions thereof by the adhesive member while the foldable housing is being folded or unfolded,
wherein the first flexible portion of the first FPCB is spaced apart from the second flexible portion of the second FPCB in a direction of the folding axis.

2. The foldable electronic device of claim 1,
wherein the first FPCB includes at least one radio frequency (RF) signal line and the second FPCB includes a power line that is less sensitive to an impedance change than a wire included in the first FPCB.

3. The foldable electronic device of claim 2,
wherein an antenna module disposed in the second housing portion is configured to communicate RF signals with a communication processor included in the first housing portion via the at least one RF signal line included in the first FPCB.

4. The foldable electronic device of claim 1,
the first FPCB is formed to be thinner and narrower than the second FPCB.

5. The foldable electronic device of claim 1,
wherein the second flexible portion of the second FPCB is spaced apart and substantially laterally parallel from the first flexible portion of the first FPCB.

6. The foldable electronic device of claim 1,
wherein the adhesive member is provided on each of a top surface and a bottom surface of the first FPCB.

7. The foldable electronic device of claim 1, wherein the adhesive member is attached to at least a portion of the first FPCB, and a portion of the adhesive member extends from the at least a portion of the first FPCB and is attached to the second FPCB, thereby connecting the first FPCB and the second FPCB.

8. The foldable electronic device of claim 1, wherein the first FPCB and the second FPCB are branched off from substantially one FPCB.

9. The foldable electronic device of claim 1, wherein one or more slits are formed in the adhesive member.

10. The foldable electronic device of claim 9, wherein the slits are formed in a direction parallel to the folding axis.

11. The foldable electronic device of claim 9, wherein a plurality of slits are provided, and the plurality of slits are disposed to be spaced apart from each other in larger intervals as a distance from a center of the folding axis increases.

12. The foldable electronic device of claim 9, wherein a plurality of slits are provided, and a width of a slit located far from a center of the folding axis is larger than a width of a slit located close to the center of the folding axis.

13. The foldable electronic device of claim 1,
wherein the first FPCB includes a first rigid portion and is fixed to the first housing portion through the first rigid portion, and the second FPCB includes a second rigid portion and is fixed to the second housing portion through the second rigid portion.

14. The foldable electronic device of claim 1,
wherein the hinge space is defined by the at least a portion of the hinge structure and the at least a portion of the hinge cover.

15. The foldable electronic device of claim 1,
wherein the adhesive member, located within a designated area of the hinge structure, is configured to guide a bending shape of the first flexible portion and a bending shape of the second flexible portion while the foldable housing is being folded and unfolded.

* * * * *